US012666811B2

(12) United States Patent
Huang et al.

(10) Patent No.: US 12,666,811 B2
(45) Date of Patent: Jun. 23, 2026

(54) DISPLAY DEVICE, DISPLAY PANEL AND MANUFACTURING METHOD THEREOF

(71) Applicant: BOE TECHNOLOGY GROUP CO., LTD., Beijing (CN)

(72) Inventors: Kuanta Huang, Beijing (CN); Yuhao Lee, Beijing (CN); Dacheng Zhang, Beijing (CN); Hui Tong, Beijing (CN); Xiaobin Shen, Beijing (CN); Shipeng Li, Beijing (CN); Chao Yang, Beijing (CN); Dongsheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/641,532

(22) Filed: Apr. 22, 2024

(65) Prior Publication Data

US 2024/0268160 A1 Aug. 8, 2024

Related U.S. Application Data

(63) Continuation of application No. 17/428,326, filed as application No. PCT/CN2021/088701 on Apr. 21, 2021, now Pat. No. 12,317,689, which is a continuation of application No. PCT/CN2020/085955, filed on Apr. 21, 2020.

(51) Int. Cl.
| | |
|---|---|
| *H10K 59/122* | (2023.01) |
| *H10K 50/844* | (2023.01) |
| *H10K 59/80* | (2023.01) |
| *H10K 71/00* | (2023.01) |

(52) U.S. Cl.
CPC ......... *H10K 59/122* (2023.02); *H10K 50/844* (2023.02); *H10K 59/80521* (2023.02); *H10K 59/873* (2023.02); *H10K 71/00* (2023.02)

(58) Field of Classification Search
CPC ............. H10K 59/1201; H10K 59/122; H10K 59/80521; H10K 59/124
See application file for complete search history.

(56) References Cited

U.S. PATENT DOCUMENTS

| | | | |
|---|---|---|---|
| 8,816,339 B2 | 8/2014 | Kawamura et al. | |
| 9,324,947 B2 | 4/2016 | Sato et al. | |
| 9,515,132 B2 | 12/2016 | Sato et al. | |
| 9,666,650 B2 | 5/2017 | Zhang | |
| 10,446,633 B2 | 10/2019 | Liu et al. | |

(Continued)

FOREIGN PATENT DOCUMENTS

| | | |
|---|---|---|
| CN | 102405686 A | 4/2012 |
| CN | 103137652 A | 6/2013 |

(Continued)

OTHER PUBLICATIONS

Office Action from U.S. Appl. No. 17/428,326 dated Aug. 23, 2024.

(Continued)

*Primary Examiner* — Vincent Wall
(74) *Attorney, Agent, or Firm* — Calfee, Halter & Griswold LLP

(57) ABSTRACT

A display device, a display panel, and a manufacturing method thereof are proposed. The display panel includes a substrate, a first insulation layer, a first electrode layer, a pixel definition layer, a light-emitting function layer and a second electrode.

20 Claims, 18 Drawing Sheets

(56)  References Cited

U.S. PATENT DOCUMENTS

| 10,504,976 | B2 | 12/2019 | Hanashmia et al. |
| 2008/0122347 | A1* | 5/2008 | Lee ................. H10K 59/80521 |
| | | | 445/24 |
| 2012/0049175 | A1* | 3/2012 | Ono ..................... H10K 59/122 |
| | | | 438/34 |
| 2012/0208311 | A1 | 8/2012 | Bang et al. |
| 2012/0228603 | A1 | 9/2012 | Nakamura |
| 2013/0069085 | A1 | 3/2013 | Kang et al. |
| 2013/0099221 | A1* | 4/2013 | Kawamura .......... H10K 59/122 |
| | | | 438/34 |
| 2014/0353599 | A1 | 12/2014 | Kang |
| 2015/0014636 | A1* | 1/2015 | Kang ................. H10K 59/1213 |
| | | | 438/26 |
| 2015/0060815 | A1 | 3/2015 | Sato |
| 2015/0069361 | A1* | 3/2015 | Sato ..................... H10K 71/211 |
| | | | 438/34 |
| 2015/0144902 | A1 | 5/2015 | Do et al. |
| 2015/0179719 | A1 | 6/2015 | Nam et al. |
| 2016/0013438 | A1 | 1/2016 | Im et al. |
| 2016/0079325 | A1 | 3/2016 | Lee et al. |
| 2016/0190508 | A1 | 6/2016 | Nakamura |
| 2016/0204187 | A1 | 7/2016 | Sato et al. |
| 2016/0260787 | A1 | 9/2016 | Kim |
| 2016/0284774 | A1* | 9/2016 | Zhang .................. H10D 86/411 |
| 2016/0322437 | A1 | 11/2016 | Sakamoto et al. |
| 2017/0005286 | A1* | 1/2017 | Yun ........................ H10K 59/35 |
| 2017/0062770 | A1* | 3/2017 | Jang ........................ H10K 50/11 |
| 2017/0084676 | A1 | 3/2017 | Jang et al. |
| 2017/0117337 | A1 | 4/2017 | Kimura et al. |
| 2017/0125738 | A1* | 5/2017 | Kim ..................... H10K 59/877 |
| 2017/0317154 | A1 | 11/2017 | Heo |
| 2018/0062106 | A1* | 3/2018 | Heo .................. H01L 21/02008 |
| 2018/0120620 | A1* | 5/2018 | Shim .................. H10K 59/1315 |
| 2018/0123081 | A1* | 5/2018 | Baik .................... H10K 50/858 |
| 2018/0190737 | A1 | 7/2018 | Yang et al. |
| 2018/0366524 | A1 | 12/2018 | Bang et al. |
| 2019/0006443 | A1 | 1/2019 | Hanashima et al. |
| 2019/0006557 | A1* | 1/2019 | Kim ........................ H10D 86/60 |
| 2019/0096971 | A1* | 3/2019 | Ukigaya ................ H10K 50/15 |
| 2019/0115403 | A1 | 4/2019 | Kang |
| 2019/0123121 | A1 | 4/2019 | Liu et al. |
| 2019/0386248 | A1 | 12/2019 | Itonaga |
| 2020/0043998 | A1 | 2/2020 | Choi et al. |
| 2020/0058708 | A1 | 2/2020 | Jang et al. |
| 2020/0152717 | A1 | 5/2020 | Hwang |
| 2020/0212146 | A1 | 7/2020 | Shin et al. |
| 2020/0251541 | A1 | 8/2020 | Kim et al. |
| 2020/0279896 | A1 | 9/2020 | Cao |
| 2020/0295300 | A1* | 9/2020 | Chung ................. H10K 85/624 |
| 2020/0328264 | A1 | 10/2020 | Wu et al. |
| 2021/0091158 | A1 | 3/2021 | Kasahara |
| 2022/0052136 | A1* | 2/2022 | Wang ................... H10K 59/131 |
| 2022/0344419 | A1* | 10/2022 | Wang .............. H10K 59/80515 |
| 2024/0365602 | A1* | 10/2024 | Yamazaki ........ H10K 59/80521 |

FOREIGN PATENT DOCUMENTS

| CN | 103311265 | A | 9/2013 |
| CN | 103887261 | A | 6/2014 |
| CN | 104517997 | A | 4/2015 |
| CN | 103311265 | B | 5/2016 |
| CN | 107808895 | A | 3/2018 |
| CN | 109216413 | A | 1/2019 |
| CN | 110808340 | A | 2/2020 |
| CN | 212342660 | U | 1/2021 |
| CN | 113451524 | A | 9/2021 |
| CN | 118019391 | A | 5/2024 |
| DE | 102019120687 | B4 | 5/2024 |
| EP | 4131454 | A1 | 2/2023 |
| JP | 2011044271 | A | 3/2011 |
| JP | 2011249089 | A | 12/2011 |
| JP | 2017073268 | A | 4/2017 |
| JP | 2019012684 | A | 1/2019 |
| JP | 2019067525 | A | 4/2019 |
| KR | 20110060474 | A | 6/2011 |
| WO | 2012/017498 | A1 | 2/2012 |

OTHER PUBLICATIONS

Office Action from U.S. Appl. No. 18/336,196 dated Sep. 19, 2024.
Office Action from U.S. Appl. No. 18/336,892 dated Oct. 7, 2024.
Written Opinion from PCT/CN2020/085955 dated Jan. 27, 2021.
International Search Report from PCT/CN2020/085955 dated Jan. 27, 2021.
Written Opinion from PCT/CN2021/088701 dated Aug. 2, 2021.
International Search Report from PCT/CN2021/088701 dated Aug. 2, 2021.
Office action from Chinese Application No. 202180000830.2 dated Aug. 4, 2022.
Office action from Chinese Application No. 202180000564.9 dated Sep. 15, 2022.
Office action from U.S. Appl. No. 17/428,326 dated Oct. 17, 2023.
Office action from U.S. Appl. No. 17/428,326 dated Jan. 9, 2024.
Allowance from U.S. Appl. No. 17/264,446 dated Oct. 18, 2023.
Yokoyama et al., "Ultra-high-resolution 105-8-ppi OLED displays with 2.78-in size using CAAC-IGZO FETs with tandem OLED device and single OLED device", J. of the SID 24/3, 2016, 9 pgs.
Extended European Search Report of EP application No. 21726546.1 dated May 8, 2024.
Non-final Office Action of U.S. Appl. No. 18/336,892 dated Jun. 25, 2025.
First Office Action of KR application No. 10-2021-7016207 dated Aug. 20, 2025.
First Office Action of JP application No. 2025-024830 dated Mar. 3, 2026.
First Office Action of JP application No. 2025-024832 dated Mar. 31, 2026.

* cited by examiner

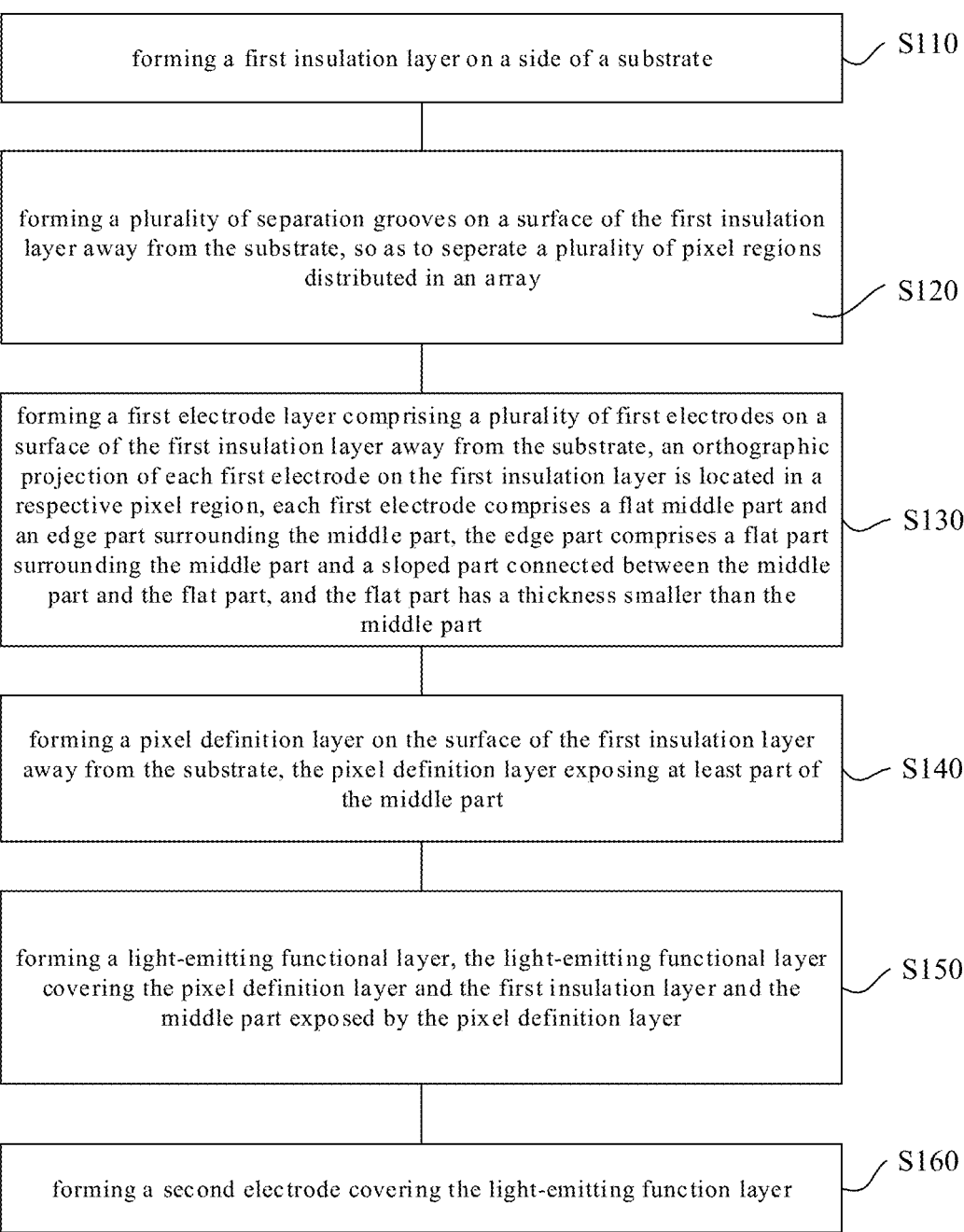

forming a first insulation layer on a side of a substrate          S110 forming a plurality of separation grooves on a surface of the first insulation layer away from the substrate, so as to seperate a plurality of pixel regions distributed in an array          S120 forming a first electrode layer comprising a plurality of first electrodes on a surface of the first insulation layer away from the substrate, an orthographic projection of each first electrode on the first insulation layer is located in a respective pixel region, each first electrode comprises a flat middle part and an edge part surrounding the middle part, the edge part comprises a flat part surrounding the middle part and a sloped part connected between the middle part and the flat part, and the flat part has a thickness smaller than the middle part          S130 forming a pixel definition layer on the surface of the first insulation layer away from the substrate, the pixel definition layer exposing at least part of the middle part          S140 forming a light-emitting functional layer, the light-emitting functional layer covering the pixel definition layer and the first insulation layer and the middle part exposed by the pixel definition layer          S150 forming a second electrode covering the light-emitting function layer          S160

Fig. 14

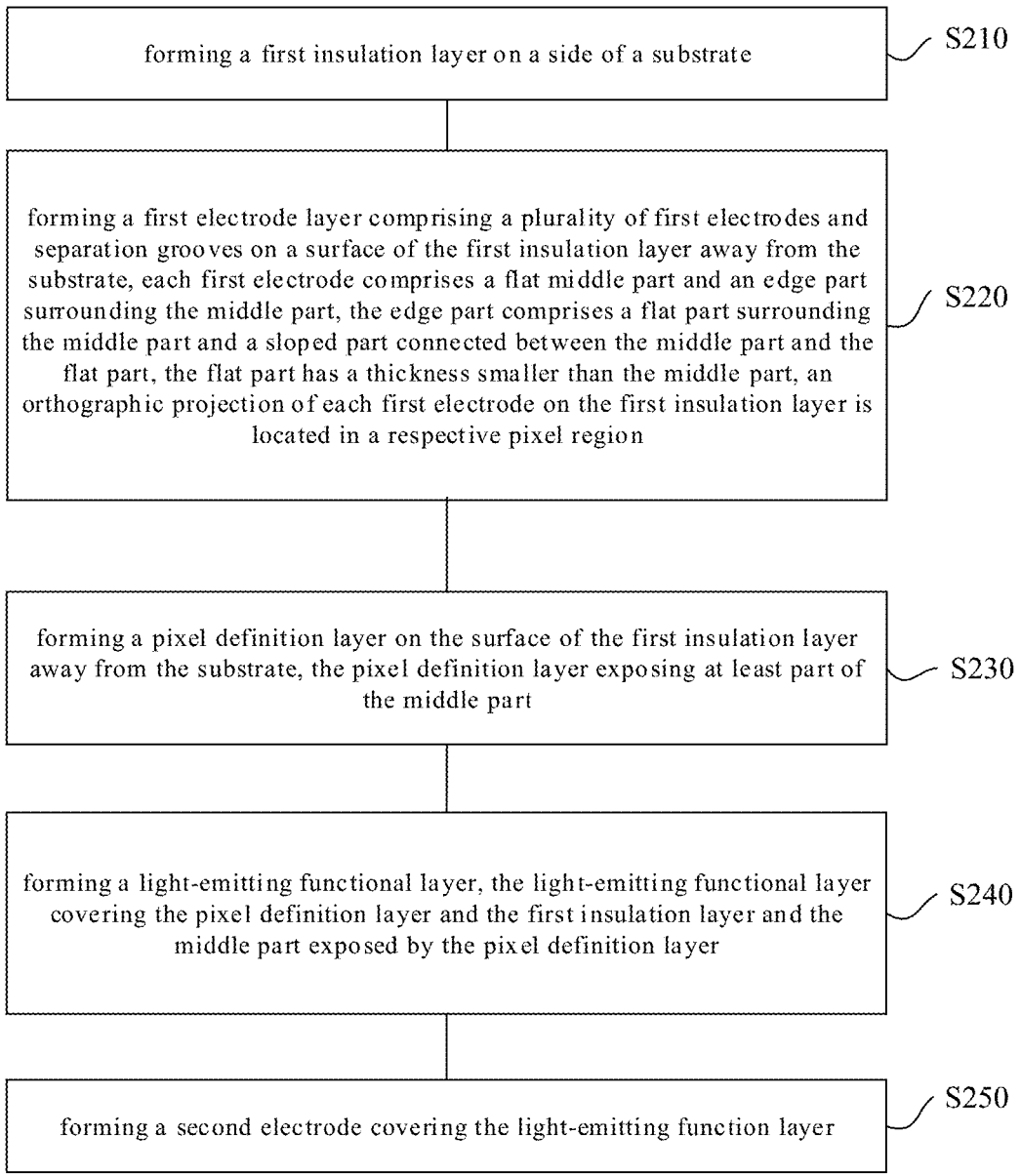

| forming a first insulation layer on a side of a substrate | S210 |
| forming a first electrode layer comprising a plurality of first electrodes and separation grooves on a surface of the first insulation layer away from the substrate, each first electrode comprises a flat middle part and an edge part surrounding the middle part, the edge part comprises a flat part surrounding the middle part and a sloped part connected between the middle part and the flat part, the flat part has a thickness smaller than the middle part, an orthographic projection of each first electrode on the first insulation layer is located in a respective pixel region | S220 |
| forming a pixel definition layer on the surface of the first insulation layer away from the substrate, the pixel definition layer exposing at least part of the middle part | S230 |
| forming a light-emitting functional layer, the light-emitting functional layer covering the pixel definition layer and the first insulation layer and the middle part exposed by the pixel definition layer | S240 |
| forming a second electrode covering the light-emitting function layer | S250 |

Fig. 15

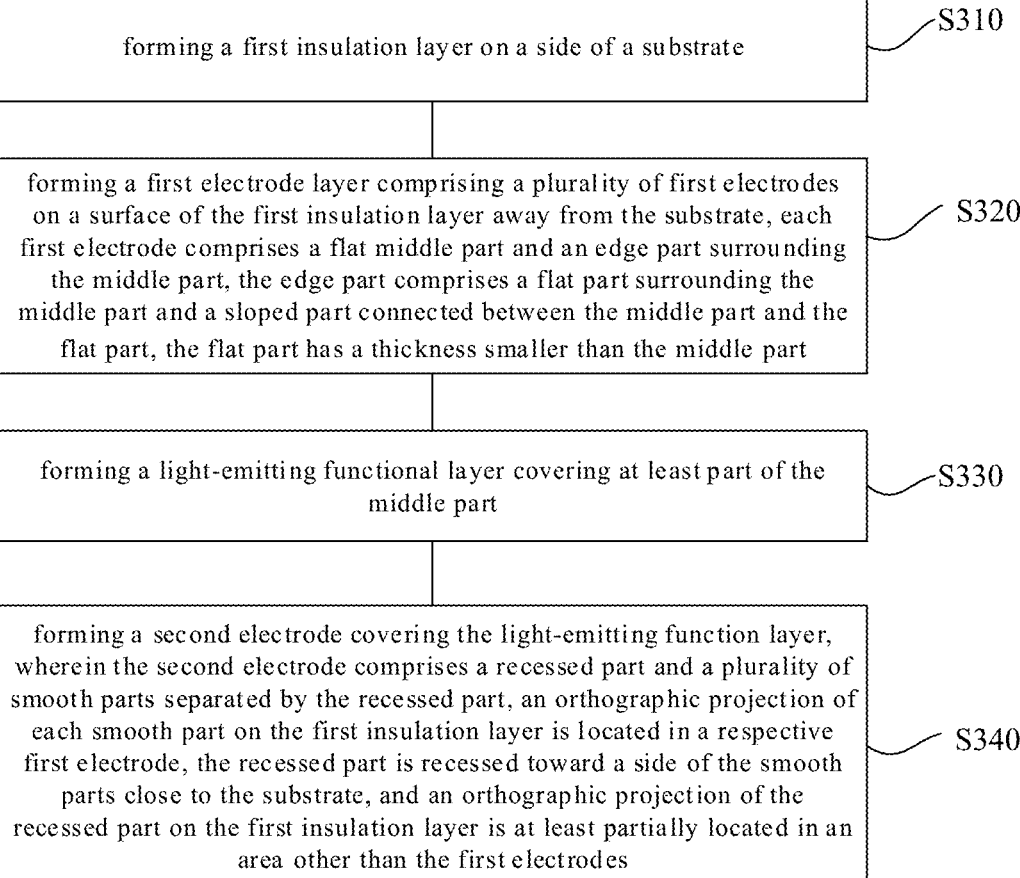

forming a first insulation layer on a side of a substrate — S310 forming a first electrode layer comprising a plurality of first electrodes on a surface of the first insulation layer away from the substrate, each first electrode comprises a flat middle part and an edge part surrounding the middle part, the edge part comprises a flat part surrounding the middle part and a sloped part connected between the middle part and the flat part, the flat part has a thickness smaller than the middle part — S320 forming a light-emitting functional layer covering at least part of the middle part — S330 forming a second electrode covering the light-emitting function layer, wherein the second electrode comprises a recessed part and a plurality of smooth parts separated by the recessed part, an orthographic projection of each smooth part on the first insulation layer is located in a respective first electrode, the recessed part is recessed toward a side of the smooth parts close to the substrate, and an orthographic projection of the recessed part on the first insulation layer is at least partially located in an area other than the first electrodes — S340

Fig. 16

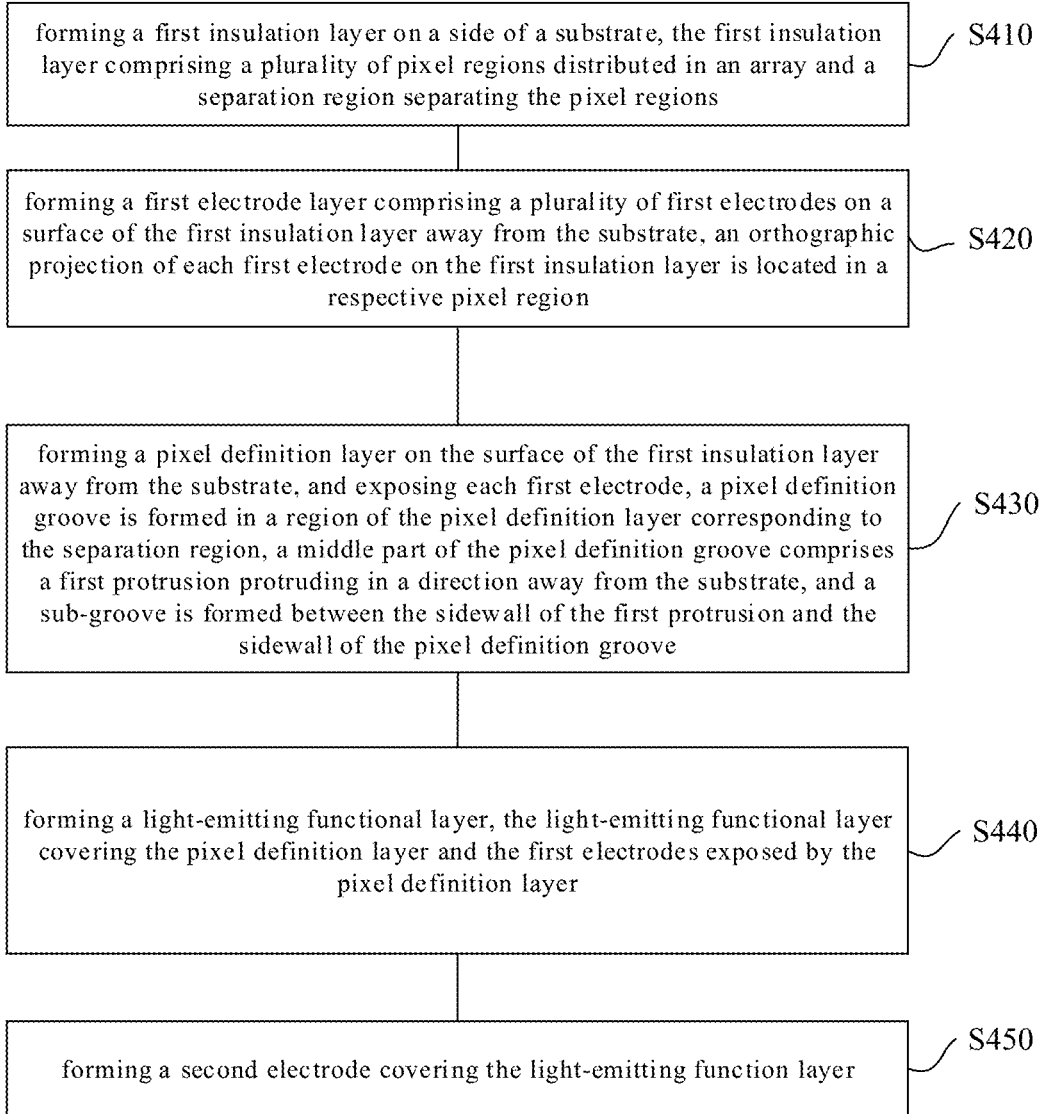

forming a first insulation layer on a side of a substrate, the first insulation layer comprising a plurality of pixel regions distributed in an array and a separation region separating the pixel regions          S410 forming a first electrode layer comprising a plurality of first electrodes on a surface of the first insulation layer away from the substrate, an orthographic projection of each first electrode on the first insulation layer is located in a respective pixel region          S420 forming a pixel definition layer on the surface of the first insulation layer away from the substrate, and exposing each first electrode, a pixel definition groove is formed in a region of the pixel definition layer corresponding to the separation region, a middle part of the pixel definition groove comprises a first protrusion protruding in a direction away from the substrate, and a sub-groove is formed between the sidewall of the first protrusion and the sidewall of the pixel definition groove          S430 forming a light-emitting functional layer, the light-emitting functional layer covering the pixel definition layer and the first electrodes exposed by the pixel definition layer          S440 forming a second electrode covering the light-emitting function layer          S450

Fig. 17

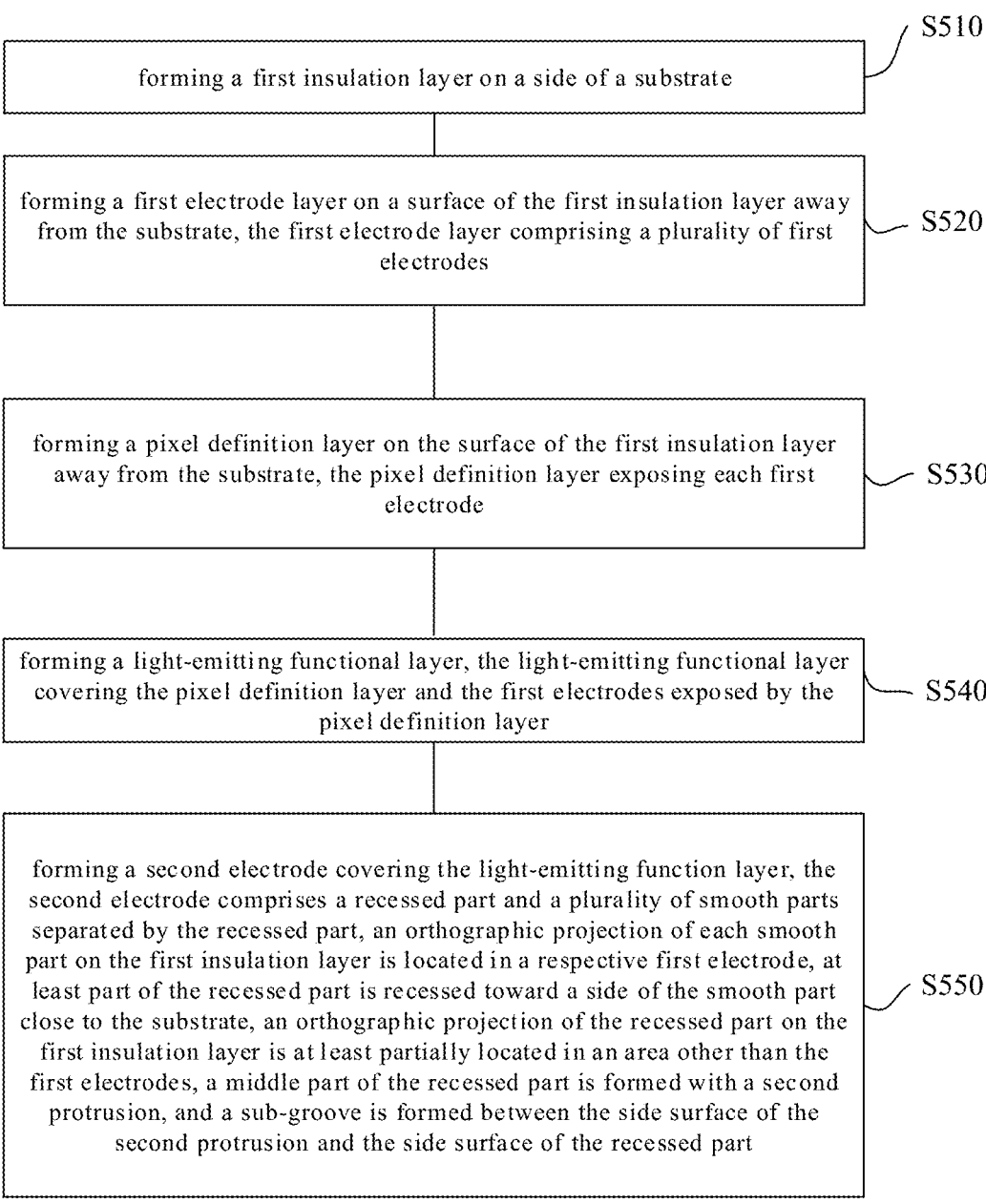

forming a first insulation layer on a side of a substrate — S510 forming a first electrode layer on a surface of the first insulation layer away from the substrate, the first electrode layer comprising a plurality of first electrodes — S520 forming a pixel definition layer on the surface of the first insulation layer away from the substrate, the pixel definition layer exposing each first electrode — S530 forming a light-emitting functional layer, the light-emitting functional layer covering the pixel definition layer and the first electrodes exposed by the pixel definition layer — S540 forming a second electrode covering the light-emitting function layer, the second electrode comprises a recessed part and a plurality of smooth parts separated by the recessed part, an orthographic projection of each smooth part on the first insulation layer is located in a respective first electrode, at least part of the recessed part is recessed toward a side of the smooth part close to the substrate, an orthographic projection of the recessed part on the first insulation layer is at least partially located in an area other than the first electrodes, a middle part of the recessed part is formed with a second protrusion, and a sub-groove is formed between the side surface of the second protrusion and the side surface of the recessed part — S550

Fig. 18

DISPLAY DEVICE, DISPLAY PANEL AND MANUFACTURING METHOD THEREOF

CROSS REFERENCE TO RELATED APPLICATION(S)

The present application is a Continuation Application of U.S. patent application Ser. No. 17/428,326, U.S. patent application Ser. No. 17/428,326 is a 35 U.S.C. 371 national phase application of PCT International Application No. PCT/CN2021/088701, and PCT International Application No. PCT/CN2021/088701 claims the priority of PCT application No. PCT/CN2020/085955, the entire contents of which are all incorporated herein by reference in their entireties.

TECHNICAL FIELD

The present disclosure relates to the field of display technology, and in particular, to a display device, a display panel, and a manufacturing method of the display panel.

BACKGROUND

Currently, Organic Light-Emitting Diode (OLED) display panels are more and more widely used. In an OLED display panel, the light-emitting device usually includes a plurality of OLED light-emitting units distributed in an array, and each light-emitting unit can emit light independently in order to display an image. However, due to reasons in the manufacturing process, the luminescence stability of the OLED light-emitting device still needs to be improved.

It should be noted that the information disclosed in the background section above is only used to enhance understanding of the background of the present disclosure, and therefore may include information that does not constitute the prior art known to those of ordinary skill in the art.

SUMMARY

The purpose of the present disclosure is to overcome the above-mentioned shortcomings of the prior art and to provide a display device, a display panel, and a manufacturing method of the display panel.

According to an aspect of the present disclosure, there is provided a display panel, including:

a substrate;

a first insulation layer, provided on a side of the substrate, wherein the first insulation layer has a plurality of pixel regions distributed in an array and a separation region separating the pixel regions;

a first electrode layer, provided on a surface of the first insulation layer away from the substrate and including a plurality of first electrodes, wherein the orthographic projection of each of the first electrodes on the first insulation layer is located in a respective pixel region;

a pixel definition layer, provided on the surface of the first insulation layer away from the substrate and exposing each of the first electrodes, wherein the pixel definition layer is formed with a pixel definition groove in a region corresponding to the separation region, a middle part of the pixel definition groove has a first protrusion protruding in a direction away from the substrate, and a sub-groove is formed between the sidewall of the first protrusion and the sidewall of the pixel definition groove;

a light-emitting functional layer, covering the pixel definition layer and the first electrodes exposed by the pixel definition layer; and a second electrode, covering the light-emitting function layer.

In an exemplary embodiment of the present disclosure, the two sidewalls of the first protrusion are inclined surfaces that expand toward the substrate, and the two sidewalls of the pixel definition groove are inclined surfaces that contract toward the substrate.

In an exemplary embodiment of the present disclosure, the slope of the sidewall of the first protrusion is different from the slope of the sidewall of the pixel definition groove.

In an exemplary embodiment of the present disclosure, the thickness of the first protrusion is smaller than the depth of the pixel definition groove.

In an exemplary embodiment of the present disclosure, the orthographic projection of the middle part of the pixel definition groove on the first insulation layer is located in the separation region.

In an exemplary embodiment of the present disclosure, the pixel definition layer includes a spacing part and an extension part, wherein the spacing part is located in an area other than the first electrodes, and the pixel definition groove is at least partially provided in the spacing part. Besides, the extension part is connected to the spacing part, extends to the surface of the first electrodes away from the substrate, and covers the first electrodes partially.

In an exemplary embodiment of the present disclosure, the width of the extension part covering any one of the first electrodes is smaller than the width of the spacing part between two adjacent ones of the first electrodes.

In an exemplary embodiment of the present disclosure, at least two of the first electrodes have different thicknesses.

In an exemplary embodiment of the present disclosure, the maximum depth of the pixel definition groove is not more than 60% of the sum of the thicknesses of the light-emitting function layer and the first electrodes.

According to an aspect of the present disclosure, there is provided a display panel including:

a substrate;

a first insulation layer, provided on a side of the substrate;

a first electrode layer, provided on a surface of the first insulation layer away from the substrate and including a plurality of first electrodes;

a pixel definition layer, arranged on the surface of the first insulation layer away from the substrate, and exposing each of the first electrodes;

a light-emitting functional layer, covering the pixel definition layer and the first electrodes exposed by the pixel definition layer; and a second electrode, covering the light-emitting functional layer, and including a recessed part and a plurality of smooth parts separated by the recessed part, wherein the orthographic projection of each smooth part on the first insulation layer is located in a respective first electrode, at least part of the recessed part is recessed toward the side of the smooth parts close to the substrate, and the orthographic projection of the recessed part on the first insulation layer is at least partially located outside the first electrodes. Besides, a second protrusion is provided in the middle part of the recessed part, and a sub-recess is formed between the side surface of the second protrusion and the side surface of the recessed part.

In an exemplary embodiment of the present disclosure, the first insulation layer has a plurality of pixel regions distributed in an array and a separation region separating the pixel regions, wherein the orthographic projection of each of the first electrodes on the first insulation layer is located in a respective first electrode.

Besides, the pixel definition layer exposes each of the first electrodes, and a pixel definition groove is formed in a region corresponding to the separation region, wherein the middle part of the pixel definition groove has a first protrusion protruding in a direction away from the substrate, and a sub-groove is formed between the sidewall of the first protrusion and the sidewall of the pixel definition groove.

Further, the orthographic projection of the recessed part on the first insulation layer is at least partially located in the pixel definition groove.

In an exemplary embodiment of the present disclosure, the orthographic projection on the first insulation layer of a point of the sub-recess closest to the substrate is located in the sub-groove.

In an exemplary embodiment of the present disclosure, the recessed part includes a first side surface and a second side surface, wherein the first side surface and the second side surface are respectively connected to two sides of the second protrusion, and the first side surface and the second side surface contract toward the substrate.

In an exemplary embodiment of the present disclosure, the second protrusion includes a first sloped surface, a second sloped surface, and a connection face connected between the first sloped surface and the second sloped surface. The connection face is located on a side of the bottom sides of the first side surface and the second side surface away from the substrate, the first sloped surface is connected to the bottom side of the first side surface, and the second sloped surface is connected to the bottom side of the second side surface.

In an exemplary embodiment of the present disclosure, the minimum thickness of an area of the second electrode corresponding to the first side surface and the second side surface is larger than the minimum thickness of an area corresponding to the first sloped surface and the second sloped surface.

In an exemplary embodiment of the present disclosure, the pixel definition layer includes a spacing part and an extension part, wherein the spacing part is located in an area other than the first electrodes, and the pixel definition groove is provided in the spacing part. Further, the extension part is connected to the spacing part, extends to the surface of the first electrodes away from the substrate, and covers the first electrode partially.

Besides, the second electrode further has a protrusion part that protrudes in a direction away from the substrate, and the smooth parts are connected to the recessed part through the protrusion part, wherein the orthographic projection of the protrusion part on the substrate at least partially overlaps with the orthographic projection of the extension part on the substrate.

In an exemplary embodiment of the present disclosure, of the two protrusion parts connected to two sides of the recessed part, the distance between the substrate and a point of one protrusion part farthest from the substrate is different from the distance between the substrate and a point of the other protrusion part farthest from the substrate.

In an exemplary embodiment of the present disclosure, the display panel further includes:

a first encapsulation layer, covering the second electrode and forming a pit in a region corresponding to the recessed part.

In an exemplary embodiment of the present disclosure, the two sidewalls of the pit are narrowed and connected in a direction approaching the substrate.

According to an aspect of the present disclosure, there is provided a method for manufacturing a display panel, including:

forming a first insulation layer on a side of a substrate, wherein the first insulation layer has a plurality of pixel regions distributed in an array and a separation region separating the pixel regions;

forming a first electrode layer including a plurality of first electrodes on a surface of the first insulation layer away from the substrate, wherein the orthographic projection of each of the first electrodes on the first insulation layer is located in a respective pixel region;

forming a pixel definition layer on the surface of the first insulation layer away from the substrate, and exposing each of the first electrodes, wherein the pixel definition layer is formed with a pixel definition groove in a region corresponding to the separation region, a middle part of the pixel definition groove has a first protrusion protruding in a direction away from the substrate, and a sub-groove is formed between the sidewall of the first protrusion and the sidewall of the pixel definition groove;

forming a light-emitting functional layer, the light-emitting functional layer covering the pixel definition layer and the first electrodes exposed by the pixel definition layer; and forming a second electrode covering the light-emitting function layer.

According to an aspect of the present disclosure, there is provided a method for manufacturing a display panel, including:

forming a first insulation layer on a side of a substrate;

forming a first electrode layer on a surface of the first insulation layer away from the substrate, the first electrode layer including a plurality of first electrodes;

forming a pixel definition layer on the surface of the first insulation layer away from the substrate, the pixel definition exposing each of the first electrodes;

forming a light-emitting functional layer, the light-emitting functional layer covering the pixel definition layer and the first electrodes exposed by the pixel definition layer; and forming a second electrode covering the light-emitting function layer, wherein the second electrode includes a recessed part and a plurality of smooth parts separated by the recessed part, the orthographic projection of each smooth part on the first insulation layer is located in a respective first electrode, at least part of the recessed part is recessed toward a side of the smooth parts close to the substrate, and the orthographic projection of the recessed part on the first insulation layer is at least partially located in an area other than the first electrodes. Besides, a second protrusion is provided in the middle part of the recessed part, and a sub-recess is formed between the side surface of the second protrusion and the side surface of the recessed part.

According to an aspect of the present disclosure, there is provided a display device including the display panel as described in any one of the above embodiments.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

Figure 1:
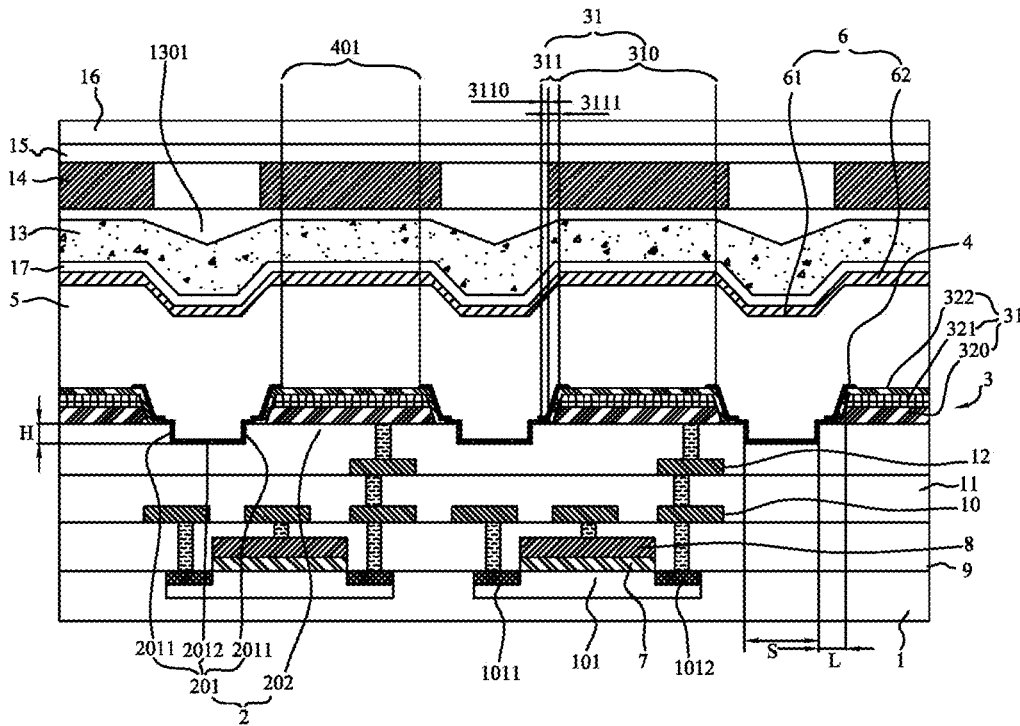

FIG. 1 is a schematic diagram of a first display panel according to an embodiment of the present disclosure.

Figure 2:
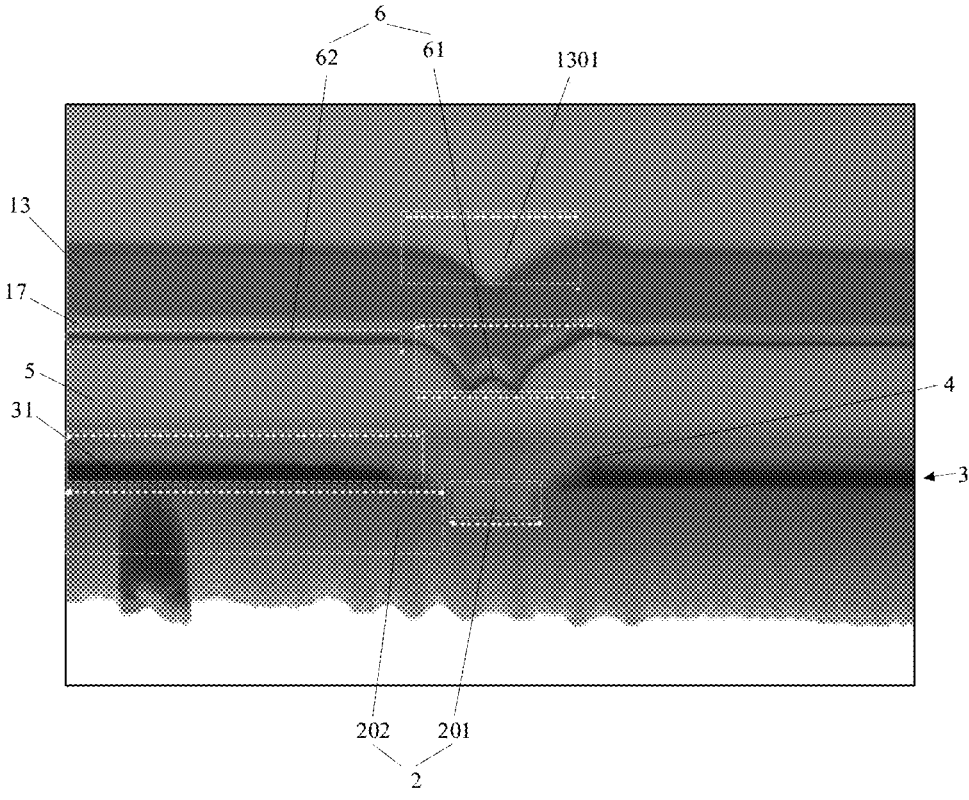

FIG. 2 is a partial electron microscope diagram of a first display panel according to an embodiment of the present disclosure.

Figure 3:
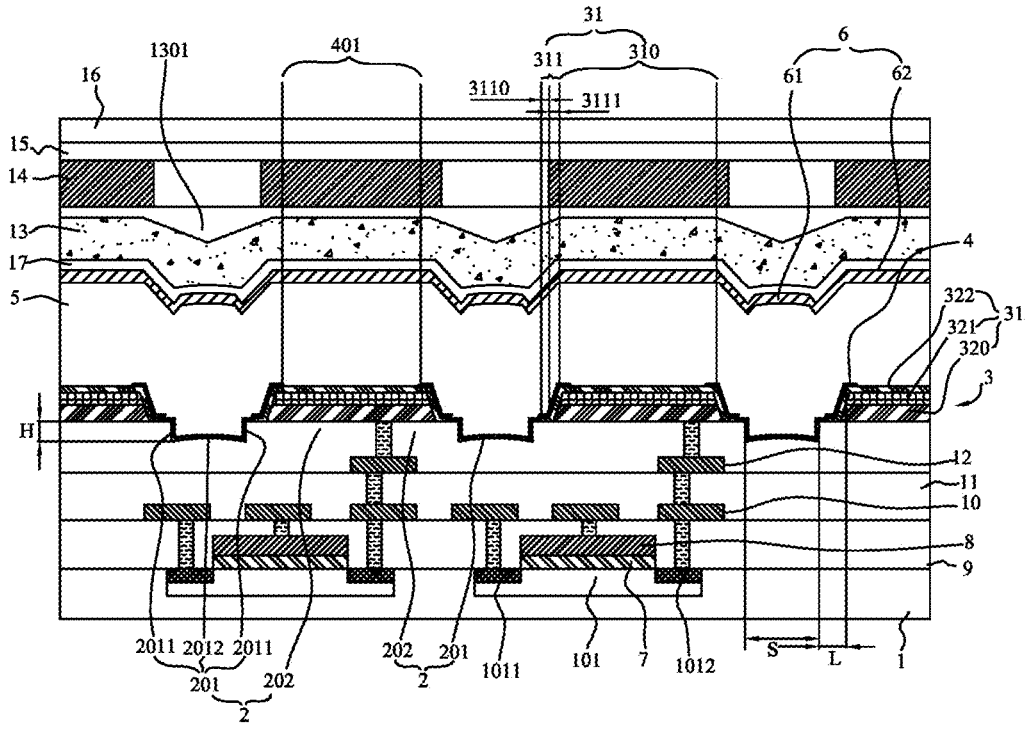

FIG. 3 is a schematic diagram of a first display panel according to another embodiment of the present disclosure.

Figure 4:
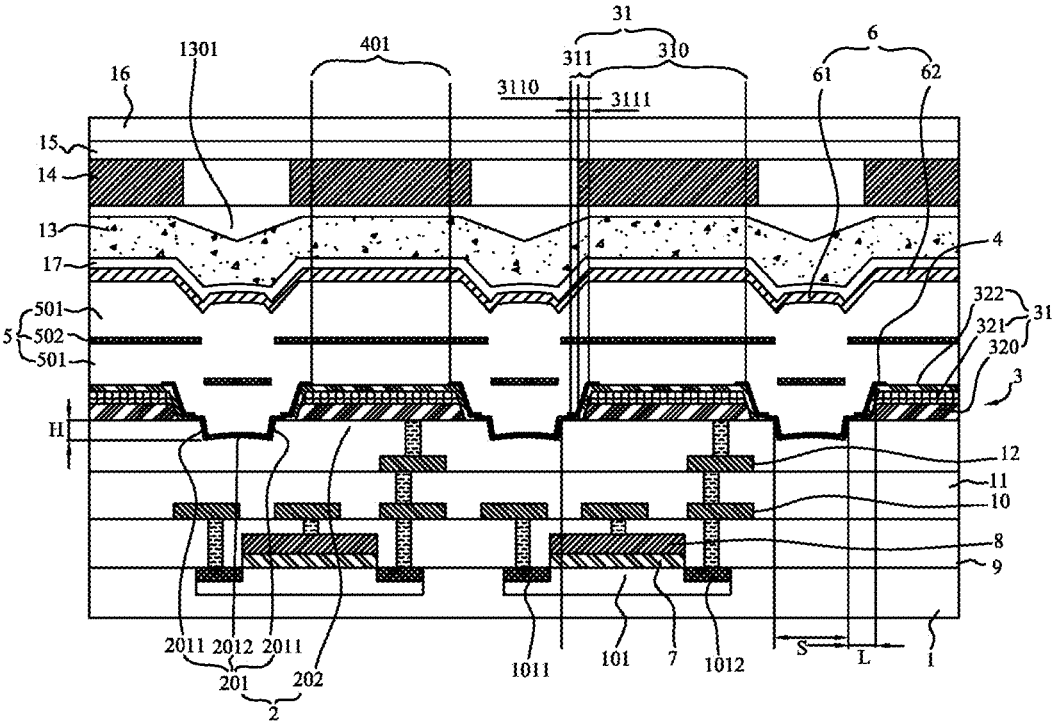

FIG. 4 is a schematic diagram of a first display panel according to still another embodiment of the present disclosure.

Figure 5:
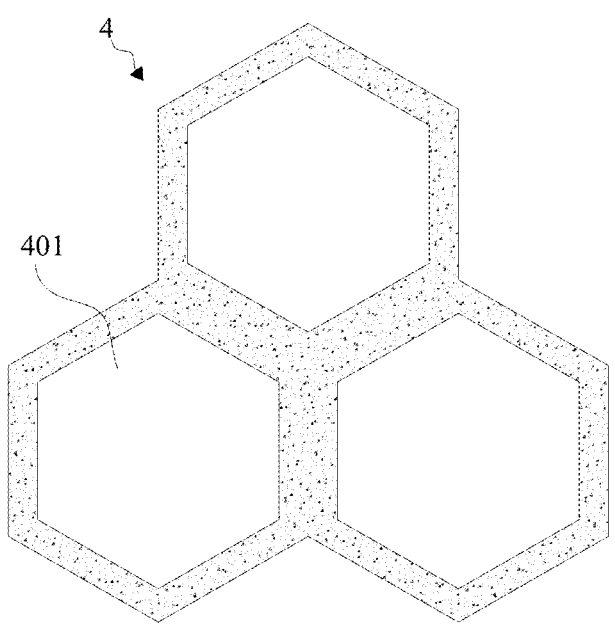

FIG. 5 is a top view of a pixel definition layer in a first display panel according to an embodiment of the present disclosure.

Figure 6:
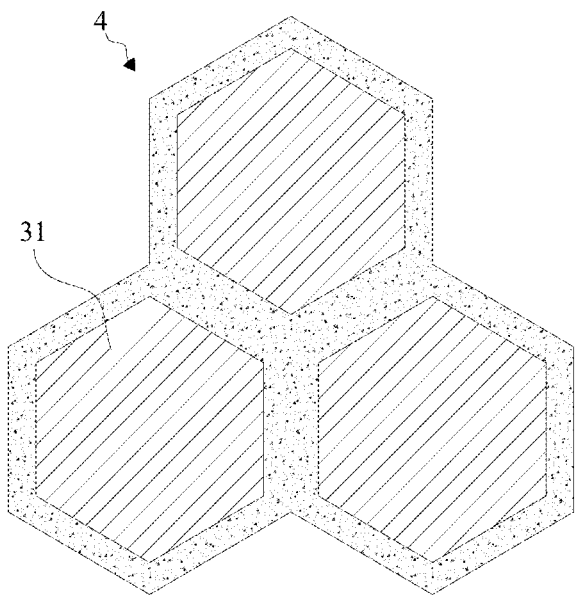

FIG. 6 is a top view of the pixel definition layer and the first electrode in a first display panel according to an embodiment of the present disclosure.

Figure 7:
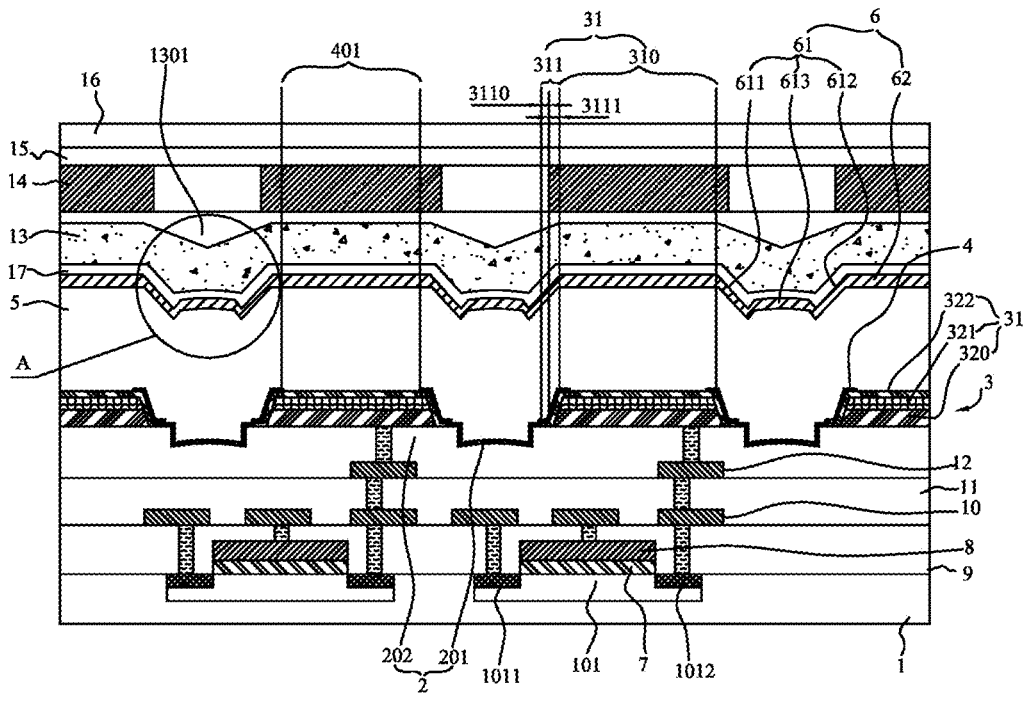

FIG. 7 is a schematic diagram of a second display panel according to an embodiment of the present disclosure.

Figure 8:
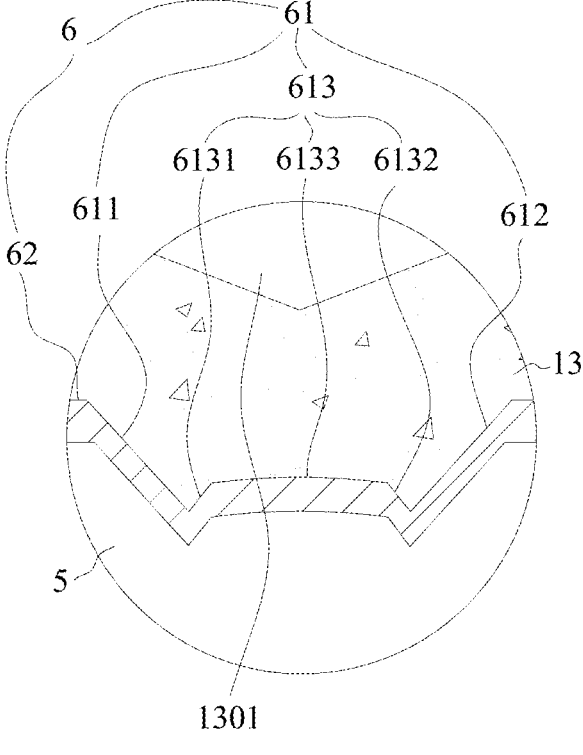

FIG. 8 is an enlarged view of part A in FIG. 7.

Figure 9:
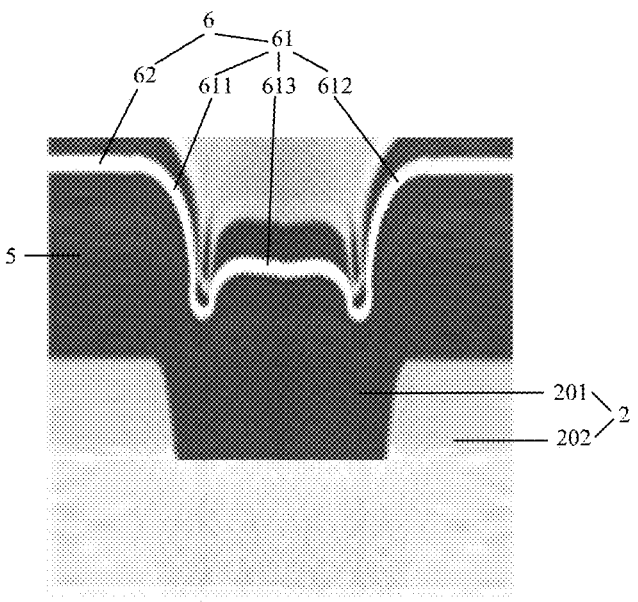

FIG. 9 is a partial electron micrograph of a second display panel according to an embodiment of the present disclosure.

Figure 10:
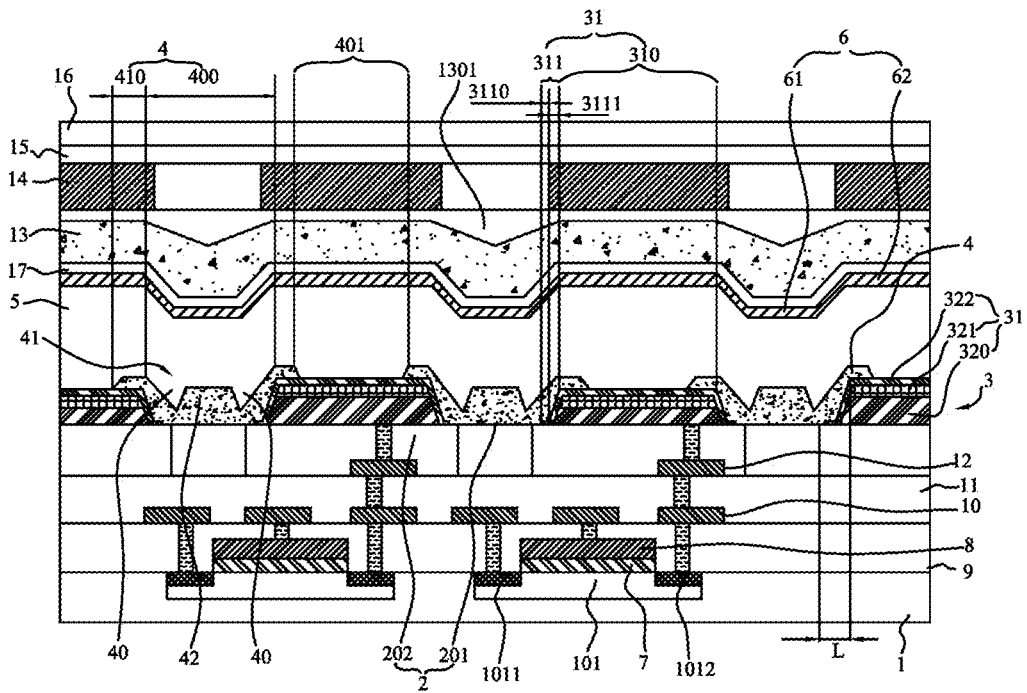

FIG. 10 is a schematic diagram of a third display panel according to an embodiment of the present disclosure.

Figure 11:
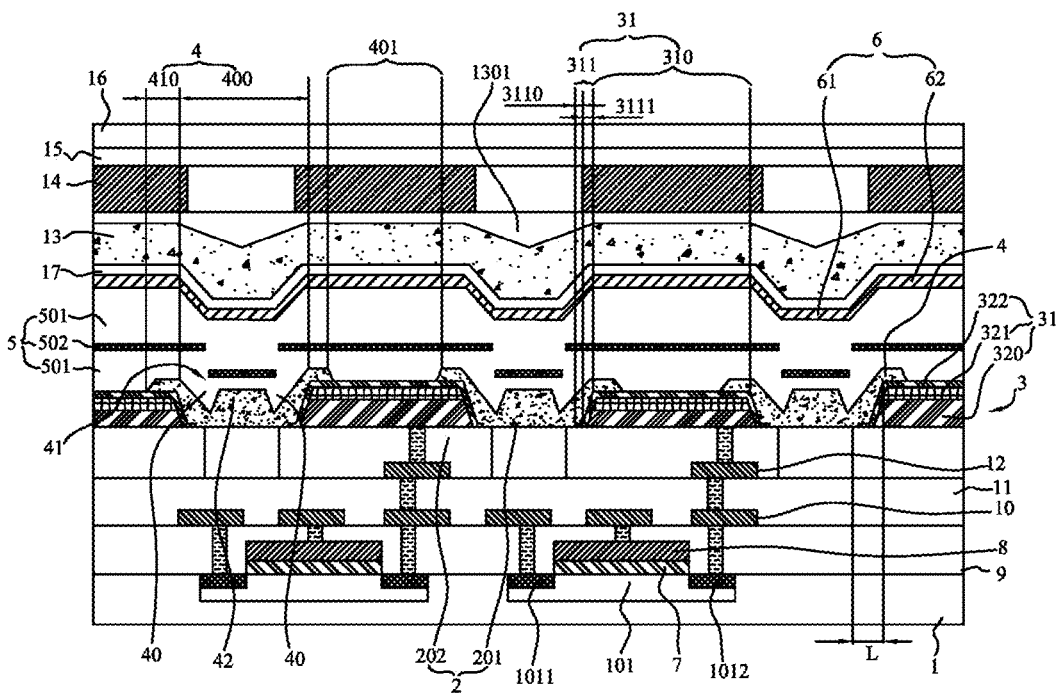

FIG. 11 is a schematic diagram of a third display panel according to another embodiment of the present disclosure.

Figure 12:
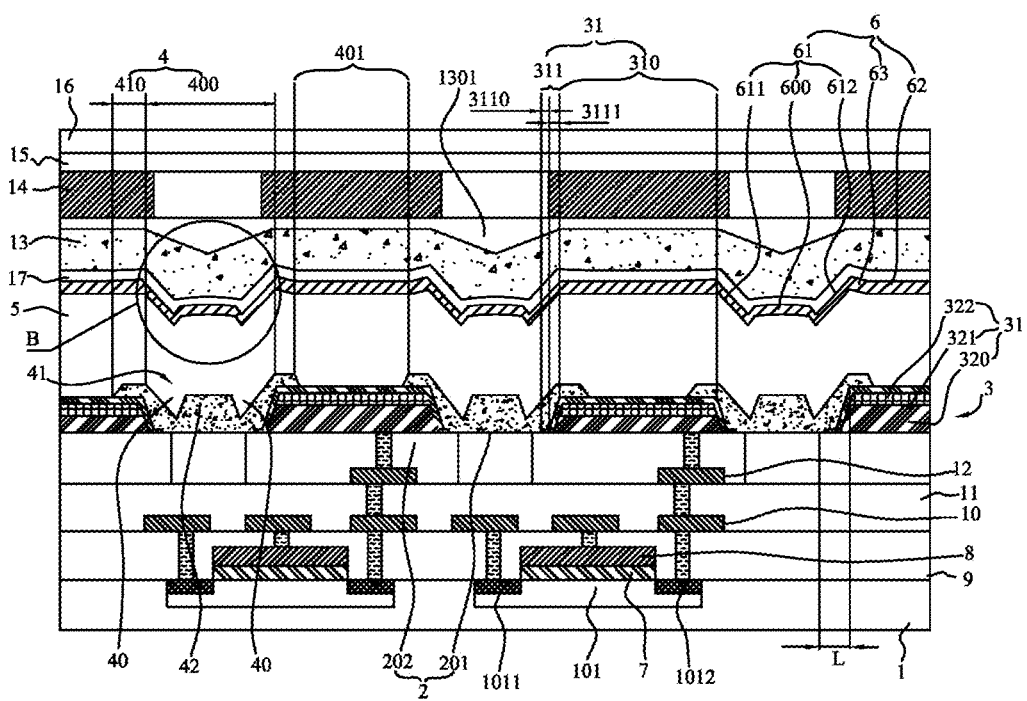

FIG. 12 is a schematic diagram of a fourth display panel according to another embodiment of the present disclosure.

Figure 13:
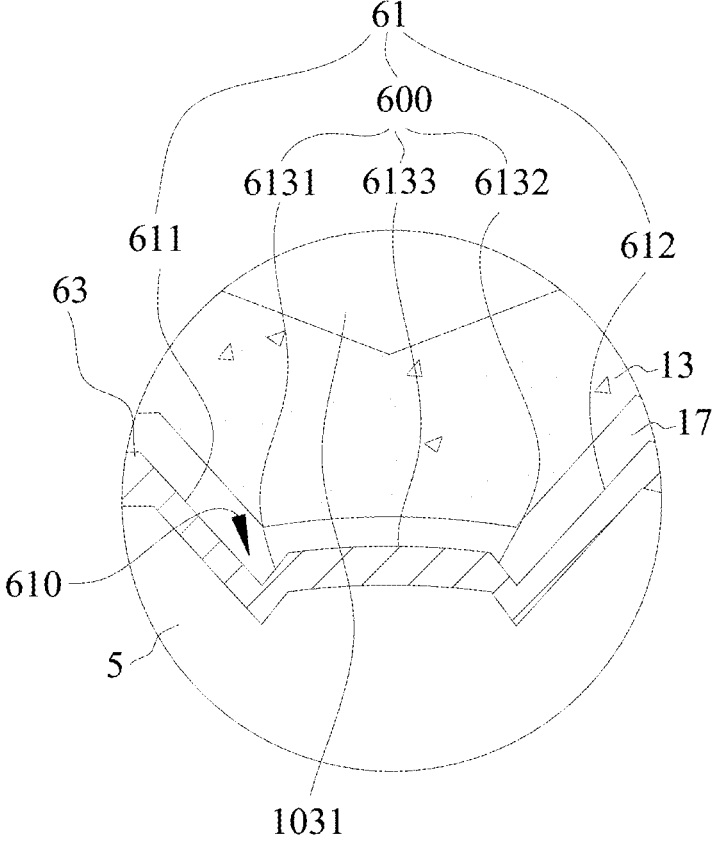

FIG. 13 is an enlarged view of part B in FIG. 12.

FIG. 14 is a schematic diagram of a method for manufacturing a first display panel according to an embodiment of the present disclosure.

FIG. 15 is a schematic diagram of a method for manufacturing a first display panel according to another embodiment of the present disclosure.

FIG. 16 is a schematic diagram of a method for manufacturing a second display panel according to an embodiment of the present disclosure.

FIG. 17 is a schematic diagram of a method for manufacturing a third display panel according to an embodiment of the present disclosure.

FIG. 18 is a schematic diagram of a method for manufacturing a fourth display panel according to an embodiment of the present disclosure.

LIST OF REFERENCE NUMERALS

1. substrate; 101. active area; 1011. source; 1012. drain; 2. flat layer; 201. separation groove; 2011. sidewall; 2012. bottom wall; 202. pixel region; 3. first electrode layer; 31, first electrode; 310, middle part; 311, edge part; 3110, flat part; 3111, sloped part 3111; 320, first conductive layer; 321, second conductive layer; 322, third conductive layer; 4. pixel definition layer; 401, opening; 41, pixel definition groove; 42, first protrusion; 40, sub groove; 400, spacing part; 410, extension part; 5. light-emitting function layer; 501, light-emitting unit layer; 502, charge generation layer; 6, second electrode; 61, recessed part; 611, first side surface; 612, second side surface; 613, bottom surface; 6131, first sloped surface; 6132, second sloped surface; 6133, connection face; 600, the second protrusion; 62, smooth part; 63, protrusion part; 7, gate insulation layer; 8, gate; 9, second insulation layer; 10, first wiring layer; 11. third insulation layer; 12. second wiring layer; 13. first encapsulation layer; 1301; pit; 14. color film layer; 15. second encapsulation layer; 16. transparent cover plate; 17. light extraction layer.

DETAILED DESCRIPTION OF THE EMBODIMENTS

Example embodiments will now be described more fully with reference to the accompanying drawings. However, the example embodiments can be implemented in various forms, and should not be construed as being limited to the embodiments set forth herein. On the contrary, these embodiments are provided so that the present disclosure will be comprehensive and complete, and fully convey the concept of the example embodiments to those skilled in the art. The same reference numerals in the figures indicate the same or similar structures, and thus their detailed descriptions will be omitted. In addition, the drawings are only schematic illustrations of the present disclosure, and are not necessarily drawn to scale.

The terms "a", "an", "the", "said" and "at least one" are used to indicate the presence of one or more elements/components/etc. The terms "including" and "have" are used to indicate open-ended inclusion, and means that in addition to the listed elements/components/etc., there may be other elements/components/etc. The terms "first", "second" and "third" etc. are only used as a marker, not a limit on the number of objects.

In the related art, the OLED display panel includes a driving backplane, a plurality of first electrodes, a pixel definition layer, a light-emitting function layer, a second electrode, and a color filter layer. The array of first electrodes is distributed on the driving backplane. The pixel definition layer is provided on the surface of the driving backplane where the first electrodes are provided, and each first electrode is exposed. The light-emitting function layer covers the pixel definition layer and the surface of the first electrodes away from the driving backplane. The second electrode covers the surface of the light-emitting function layer facing away from the driving backplane. In this way, a plurality of light-emitting units can be defined by the pixel definition layer. When driven by the driving signal, the holes injected by the first electrodes and the electrons injected by the second electrode enter the light-emitting function layer and form excitons, thus the excitons radiating and transitioning to emit photons to form electroluminescence. The color filter layer is arranged on the side of the second electrode away from the driving backplate, and has a plurality of filter regions each corresponding to a respective light-emitting unit, wherein each filter region and the respective light-emitting unit can be used as a sub-pixel.

Since the thickness of the pixel definition layer is greater than that of the first electrode, when the light-emitting function layer is formed by the evaporation process, the light-emitting function layer will appear recessed at a junction part between the first electrode and the pixel definition layer, that is, at the edge of the light-emitting device. Accordingly, the second electrode forms a recessed area, and the distance between the recessed area of the second electrode and the first electrode is relatively short, which is prone to tip discharge or even short circuit, thus affecting the stability of the light-emitting device and making it difficult for the display panel to emit light stably. In the meanwhile, the recessed area of the second electrode corresponds to the first electrode, and therefore also emits light. However, because the recessed area is having a structure recessed toward the driving backplane, rather than a planar structure, light will be emitted in a scattered state across the recessed area, and at least part of the light is skewed toward adjacent sub-pixels. Thus, the light emission of the adjacent sub-pixels interferes with each other, which affects the display effect.

The light-emitting function layer is recessed in a junction part of the second electrode between the first electrode and the pixel definition layer, so that the second electrode forms a recessed area in the area corresponding to the recessed area. The recessed area is directly opposite to the first electrode. That is, the orthographic projection of the recessed area on driving backplate is located in the first electrode, so that a sharp discharge or even a short circuit may occur between the two. At the same time, the recessed area emits light, and because the recessed area is curved in shape, the light will be emitted by the recessed area in a scattered state, which interferes with the light emission of adjacent sub-pixels.

In addition, since the light-emitting functional layer is a continuous film layer so that the sub-pixels are connected to each other, at least a part of the film layer (including but not limited to the hole injection layer) in the light-emitting functional layer will cause crosstalk between adjacent sub-pixels. In particular, for a tandem OLED display panel, the light-emitting function layer includes a plurality of light-emitting unit layers, and two adjacent light-emitting unit layers are connected in series through a charge generation layer. However, the charge generation layer has good charge conduction characteristics, which will cause crosstalk between adjacent sub-pixels and affect the light-emitting effect.

In order to solve at least one of the technical problems in the above-mentioned related art, embodiments of the present disclosure provide various display panels.

A First Display Panel

As shown in FIGS. 1 and 2, the display panel may include a substrate 1, a first insulation layer 2, a first electrode layer 3, a pixel definition layer 4, a light-emitting function layer 5, and a second electrode 6.

The first insulation layer 2 is provided on a side of the substrate 1, and the surface of the first insulation layer 2 facing away from the substrate 1 is provided with a plurality of separation grooves 201 so as to divide a plurality of pixel regions 202 on the first insulation layer 2, wherein the pixel regions 202 are arranged in an array.

The first electrode layer 3 is provided on the surface of the first insulation layer 2 away from the substrate 1, and includes a plurality of first electrodes 31 distributed in an array, wherein the orthographic projection of each first electrode 31 on the first insulation layer 2 is located by a one-to-one correspondence in a respective pixel region 202. The first electrode 31 includes a flat middle part 310 and an edge part 311 surrounding the middle part 310. The edge part 311 includes a flat part 3110 surrounding the middle part 310 and a sloped part 3111 connected between the middle part 310 and the flat part 3110, wherein the thickness of the flat part 3110 is smaller than that of the middle part 310.

The pixel definition layer 4 is disposed on the surface of the first insulation layer 2 away from the substrate 1 and exposes at least part of the middle part 310.

The light-emitting function layer 5 covers the pixel definition layer 4 and the middle part 310 and the first insulation layer 2 exposed by the pixel definition layer 4.

The second electrode 6 covers the light-emitting function layer 5.

In the display panel according to an embodiment of the present disclosure, the area of the middle part 310 of each first electrode 31 exposed by the pixel definition layer 4 and the corresponding light-emitting function layer 5 and second electrode 6 can constitute a light-emitting device to emit light.

The orthographic projection of the first electrode 31 on the first insulation layer 2 is located in a respective pixel region 202 by a one-to-one correspondence, so that the separation groove 201 is located outside the first electrode 31. In this case, when the light-emitting functional layer 5 is formed, the light-emitting functional layer 5 can be recessed toward the substrate 1 at the position of the separation groove 201, so that the second electrode 6 forms a recessed part 61 in this recessed area, and the orthographic projection of the recessed part 61 on the first insulation layer 2 is at least partially located outsides the middle part 310 of the first electrode 31, that is, located outside the light-emitting device. Therefore, the position of the recessed part 61 of the second electrode 6 can be restricted by the separation groove 201, so as to prevent the tip discharge or even short circuit between the recessed part 61 and the middle part 310. This helps to ensure that the light-emitting device emits light stably. At the same time, light emission across the recessed part 61 can be reduced or even avoided, thereby reducing the mutual interference of the light emission between adjacent light-emitting devices.

As shown in FIG. 2, FIG. 2 is a partial electron micrograph of a first display panel according to an embodiment of the present disclosure. It can be seen that the orthographic projection of the recessed part 61 on the first insulation layer 2 is at least partially located outside the first electrode 31, which helps to reduce the risk of sharp discharge with the first electrode 31. At the same time, this can reduce or even prevent the recessed part 61 from emitting light, and prevent interference with adjacent sub-pixels.

Each part of the first display panel according to an embodiment of the present disclosure will be described in detail below.

As shown in FIG. 1, the material of the substrate 1 can be a semiconductor material such as single crystal silicon or polysilicon, or other hard or soft materials such as glass.

In some embodiments of the present disclosure, a plurality of driving transistors may be provided on the substrate 1, so as to drive each light-emitting device to emit light for image display. Taking a driving transistor with a top gate structure as an example, the display panel further includes a gate insulation layer 7, a gate electrode 8, a second insulation layer 9 and a first wiring layer 10. The material of the substrate 1 can be semiconductor materials such as monocrystalline silicon or polysilicon, and the substrate 1 includes an active region 101 and a source 1011 and a drain 1012 located at both ends of the active region 101. The gate insulation layer 7 covers the active region 101. The gate 8 is provided on the surface of the gate insulation layer 7 away from the substrate 1, and the material of the gate 8 may include polysilicon material. The second insulation layer 9 covers the gate 8 and the substrate 1, and the material of the second insulation layer 9 may include at least one of silicon oxide and silicon nitride. The first wiring layer 10 is provided on the surface of the second insulation layer 9 away from the substrate 1, and the gate 8, the source 1011 and the drain 1012 are all connected to the first wiring layer 10 through via holes filled with tungsten or other metals.

In addition, the display panel may further include a third insulation layer 11 and a second wiring layer 12. The third insulation layer 11 covers the first wiring layer 10 and the second insulation layer 9, and the second wiring layer 12 is provided on the surface of the third insulation layer 11 away from the substrate 1. The specific pattern of the second wiring layer 12 is not particularly limited here, and it can be connected to the first wiring layer 10 through via holes filled with tungsten or other metals.

As shown in FIG. 1, the first insulation layer 2 is provided on a side of the substrate 1. In some embodiments of the present disclosure, the first insulation layer 2 can cover the second wiring layer 12, and the first electrode 31 can be connected to the second wiring layer 12 through via holes filled with tungsten or other metals. The material of the first insulation layer 2 may include at least one of silicon nitride and silicon oxide, and of course, may also include other insulation materials. For example, the first insulation layer 2 can be planarized by a polishing process.

The surface of the first insulation layer 2 facing away from the substrate 1 can be provided with a plurality of separation grooves 201. The depth of the separation grooves 201 is smaller than the thickness of the first insulation layer 2. That is, the separation grooves 201 do not penetrate the first insulation layer 2 in the depth direction. A plurality of pixel regions 202 can be divided on the first insulation layer 2 by the separation grooves 201, and the pixel regions 202 are arranged in an array.

The shape of the orthographic projection of the pixel region 202 on the substrate 1 can be a rectangle, a pentagon, a hexagon or other polygons. Of course, it can also be a circle or other shapes, which is not specifically limited here. At the same time, the shape and size of different pixel regions 202 may be different.

In some embodiments of the present disclosure, for example, the separation groove 201 may include a first separation groove and a second separation groove, wherein the number of the first separation groove is plural, and each first separation groove extends linearly along the first direction, and distributed along the second direction at intervals. Besides, the number of the second separation grooves is plural, and each second separation groove extends linearly along the second direction, and is spaced apart along the first direction. The first direction and the second direction cross each other. For example, the first direction and the second direction are mutually perpendicular directions. In this way, a plurality of pixel regions 202 distributed in an array can be divided on the first insulation layer 2 by the staggered first separation grooves and second separation grooves.

In other embodiments of the present disclosure, the first separation groove and the second separation groove may also extend along a curved or broken track line, thereby dividing the pixel region 202 of other shapes.

Each separation groove 201 may include two opposite sidewalls 2011 and a bottom wall 2012 connected between the two sidewalls 2011. To be specific, the two sidewalls 2011 may be arranged in parallel, that is, in the direction perpendicular to the substrate 1, and the two sidewalls 2011 and their extension surfaces do not intersect. Alternatively, the two sidewalls 2011 may also be arranged at a certain angle.

As shown in FIG. 3, the bottom wall 2012 may be approximately parallel to the surface of the first insulation layer 2 facing away from the substrate 1. Alternatively, as shown in FIG. 1, the bottom wall 2012 may also be a curved surface being convex in a direction away from the substrate 1. The curvature and shape of the curved surface are not particularly limited here. In the cross section perpendicular to the substrate 1, the contour of the bottom wall 2012 can be roughly arc-shaped, parabolic or wavy. Of course, it can also be other regular or irregular shapes, as long as they are convex in the direction away from the substrate 1.

In some embodiments of the present disclosure, the two sidewalls 2011 contract toward the bottom wall 2012. That is, the distance between the two sidewalls 2011 gradually decreases toward the bottom wall 2012, so that the sidewalls 2011 have a slope with relative to the surface of the first insulation layer 2 away from the substrate 1, which slope is the angle between the sidewall 2011 and the surface of the first insulation layer 2 away from the substrate 1. Further, the slope is not less than 70° and not more than 90°. For example, the slope may be 70°, 80°, 90°, and so on.

In some embodiments of the present disclosure, the maximum distance S between the two sidewalls 2011 of the separation groove 201 may be 0.2 μm-0.7 μm, such as 0.2 μm, 0.3 μm, 0.5 μm, or 0.7 μm.

As shown in FIG. 1, the first electrode layer 3 is provided on the surface of the first insulation layer 2 away from the substrate 1, and includes a plurality of first electrodes 31 distributed in an array, wherein the orthographic projection of each first electrode 31 on the first insulation layer 2 is located in a respective pixel region 202 by one-to-one correspondence. That is, the boundary of the orthographic projection of each first electrode 31 on the substrate 1 is located in the boundary of the orthographic projection of a respective pixel region 202 on the substrate 1 by a one-to-one correspondence. Only one first electrode 31 is provided in each pixel region 202. Since the pixel region 202 is separated by the separation groove 201 and the first electrode 31 is located in the pixel region 202, the separation groove 201 is located outside the first electrode 31. The shape of the orthographic projection of each first electrode 31 on the first insulation layer 2 may be the same as the shape of the pixel region 202 where it is located, and the boundary of the first electrode 31 is located in the pixel region 202 where it is located.

In a direction parallel to the substrate 1, at least one first electrode 31 may include a middle part 310 and an edge part 311 surrounding the middle part 310, wherein the middle part 310 is a flat structure. That is, the middle part 310 is approximately parallel to the surface of the first insulation layer 2 away from the substrate 1.

In some embodiments of the present disclosure, the boundary of the orthographic projection of the middle part 310 of each first electrode 31 on the substrate 1 may be located within the boundary of the orthographic projection of the pixel region 202 (where it is located) on the substrate 1. That is, the distance L between the boundary of the orthographic projection of the middle part 310 on the substrate 1 and the boundary of the orthographic projection of the pixel region 202 (where it is located) on the substrate 1 is not zero. Further, the distance L is not less than 0.15 μm. For example, the distance may be 0.15 μm, 0.2 μm, 0.25 μm, or the like.

The edge part 311 may include a flat part 3110 and a sloped part 3111, wherein the flat part 3110 is located on the surface of the first insulation layer 2 facing away from the substrate 1 and arranged around the middle part 310. Besides, the flat part 3110 is approximately parallel to the surface of the first insulation layer 2 away from the substrate 1. At the same time, the thickness of the flat part 3110 is smaller than the thickness of the middle part 310. In some embodiments of the present disclosure, the distance between the boundary of the orthographic projection of the flat part 3110 on the substrate 1 and the boundary of the orthographic projection of the pixel region 202 (where it is located) on the substrate 1 is not zero. Of course, the boundary of the orthographic projection of the flat part 3110 on the substrate 1 overlaps with the boundary of the orthographic projection of the pixel region 202 (where it is located) on the substrate 1.

The sloped part 3111 is connected between the middle part 310 and the flat part 3110. That is, the sloped part 3111 surrounds the middle part 310, and the flat part 3110 is arranged around the sloped part 3111. In some embodiments of the present disclosure, the slope of the sloped part 3111 relative to the surface of the first insulation layer 2 away from the substrate 1 is not less than 30°, where the slope is an angle between the surface of the sloped part 3111 and the surface of the first insulation layer 2 away from the substrate 1.

The first electrode 31 includes a first conductive layer 320, a second conductive layer 321, and a third conductive layer 322. The first conductive layer 320 is provided on the surface of the first insulation layer 2 facing away from the substrate 1, and the second conductive layer 321 is provided on the surface of the first conductive layer 320 away from the substrate 1. The third conductive layer 322 is provided on the surface of the second conductive layer 321 away from the substrate 1, and extends to the first insulation layer 2 at a certain slope, thereby cladding the first conductive layer 320 and the second conductive layer 321 to protect the first conductive layer 320 and the second conductive layer 321.

The middle part 310 of the first electrode 31 includes an area of the third conductive layer 322 that is located in the surface of the second conductive layer 321 facing away from the substrate 1 and also includes the first conductive layer 320 and the second conductive layer 321. The edge part 311 includes an area of the third conductive layer 322 cladding the edges of the first conductive layer 320 and the second conductive layer 321, i.e., an area extending toward the first insulation layer 2. Exemplarily, the material of the first conductive layer 320 may include titanium (Ti), the material of the second conductive layer 321 includes silver (Ag), and the material of the third conductive layer 322 includes indium tin oxide (ITO). Of course, it may also be other materials.

As shown in FIG. 1, the pixel definition layer 4 is made of insulation material, and is provided on the surface of the first insulation layer 2 away from the substrate 1 along with the first electrode layer 3. At the same time, the pixel definition layer 4 exposes at least a portion of the middle part 310 of the first electrode 31, and the middle part 310 exposed by the pixel definition layer 4 can form, together with the corresponding light-emitting function layer 5 and second electrode 6, a light-emitting device.

In some embodiments of the present disclosure, each first electrode 31 does not completely cover the pixel region 202 where it is located, and a certain distance exists between the boundary of the orthographic projection of the flat part 3110 of the first electrode 31 on the substrate 1 and the boundary of the orthographic projection of the pixel region 202 (where it is located) on the substrate 1. The pixel definition layer 4 extends at most to the sidewalls 2011 and the bottom wall 2012 of the separation groove 201. That is, the pixel definition layer 4 is conformally attached to the pixel region 202 not covered by the first electrode 31, so that the pixel definition layer 4 is recessed in an area corresponding to the separation groove 201. The pixel definition layer 4 is provided with a plurality of openings 401, each exposing at least a portion of a respective middle part 310 in a one-to-one correspondence, so that the light-emitting range of the light-emitting device can be defined by the pixel definition layer 4.

As shown in FIGS. 5 and 6, in some embodiments of the present disclosure, the opening 401 of the pixel definition layer 4 may have a hexagonal or other polygonal structure. Besides, the first electrode 31 may also have a polygonal structure, and has the same shape as the opening 401. Of course, the first electrode 31 may also have other shapes.

As shown in FIG. 1, the light-emitting function layer 5 can be a continuous film layer, and at least partially covers the middle part 310 of each first electrode 31, that is, covers the area exposed by the opening 401. At the same time, the light-emitting function layer 5 also covers the pixel definition layer 4 and the area of the first insulation layer 2 that is not covered by the pixel definition layer 4 and the first electrode 31. When the light-emitting functional layer 5 is formed by evaporation or other processes, the light-emitting functional layer 5 is recessed in a direction approaching toward the substrate 1 in the area corresponding to the separation groove 201.

In an embodiment of the present disclosure, as shown in FIG. 4, the light-emitting function layer 5 includes a multilayer light-emitting unit layer 501, and the hole injection layer, the hole transport layer, the light-emitting layer, the electron transport layer, and the electron injection layer of each light-emitting unit layer 501 have the same distribution. At the same time, a charge generation layer 502 is provided between two adjacent light-emitting unit layers 501, so that the light-emitting unit layers 501 are connected in series through the charge generation layer 502, so as to form a series-type OLED light-emitting device.

In some other embodiments of the present disclosure, the light-emitting function layer 5 includes a light-emitting unit layer, and the light-emitting unit layer includes a hole injection layer, a hole transport layer, a light-emitting layer, an electron transport layer and an electron injection layer, which are sequentially stacked from the first electrode 31 in a direction away from the substrate 1.

The charge generation layer 502 cannot cover the sidewall 2011 of the separation groove 201, so that the charge generation layer 502 of the light-emitting device can be cut off by the separation groove 201, so as to avoid crosstalk between two adjacent light-emitting devices. Of course, the separation groove 201 can also cut off the hole injection layer or other film layers, which can also prevent crosstalk.

As shown in FIG. 1, the second electrode 6 covers the light-emitting functional layer 5, and can apply driving signals to the first electrode 31 and the second electrode 6, so that a portion of the light-emitting functional layer 5 located between the first electrode 31 and the second electrode 6 emits light.

The morphology of the second electrode 6 matches with that of the light-emitting functional layer 5, which is recessed in the recessed area of the light-emitting functional layer 5 to form a recessed part 61. Besides, a smooth part 62 is formed in the region corresponding to the middle part 310 of the first electrode 31, such that the orthographic projection of the recessed part 61 on the first insulation layer 2 is at least partially located outside the middle part 310 of the first electrode 31, so as to reduce or avoid the tip discharge between the recessed part 61 of the second electrode 6 and the first electrode 31. The material of the second electrode 6 may be an alloy material. For example, the material of the second electrode 6 may include Mg and Ag. Alternatively, the second electrode 6 may also be an alloy of Al and Li. Of course, the second electrode 6 can also use other alloys or elemental metals, which will not be listed here.

It should be noted that if the pixel definition layer 4 covers the edge of the middle part 310, the smooth part 62 can be protruding in the direction away from the substrate 1 in the area corresponding to the pixel definition layer 4 covering the middle part 310, but the height of the protrusion is smaller than the thickness of the first middle part 310 so that the smooth part 62 is generally smooth.

Further, as shown in FIGS. 1 and 2, in some embodiments of the present disclosure, the lowest point of the recessed part 61 of the second electrode 6 in the cross section perpendicular to the substrate 1 has an orthographic projection on the first insulation layer 2, which orthographic projection is located completely in the separation groove 201, that is, completely outside the middle part 310.

In order to ensure that the separation groove 201 can cut off the hole injection layer, the charge generation layer 502 or other film layers, the separation groove 201 should be made to have a certain depth. But, the separation groove 201 should also be prevented from being too deep to penetrate the first insulation layer 2 and affect the driving device. Therefore, in some embodiments of the present disclosure, in the direction perpendicular to the substrate 1, the maximum depth H of the separation groove 201 is not less than 30% of the sum of the thicknesses of the light-emitting function layer 5 and the first electrode 31. At the same time, the maximum depth H of the separation groove 201 is not more than 60% of the sum of the thickness of the light-emitting function layer 5 and the first electrode 31. To be specific, the maximum depth of the separation groove 201 refers to a distance, in the direction perpendicular to the substrate 1, between a point on the bottom wall 2012 of the separation groove 201, which point is fairest from the surface of the first insulation layer 2 away from the substrate 1, and the surface of the first insulation layer 2 away from the substrate 1. For example, in some embodiments of the present disclosure, the maximum depth H of the separation groove 201 is 1000 Å to 3000 Å.

In addition, in some embodiments of the present disclosure, as shown in FIG. 1, the first type of display panel may further include a first encapsulation layer 13, a color filter layer 14, a second encapsulation layer 15, and a transparent cover plate 16.

The first encapsulation layer 13 may cover the second electrode 6. For example, the first encapsulation layer 13 may include two inorganic layers and an organic layer between the two inorganic layers.

In some embodiments of the present disclosure, the first encapsulation layer 13 may be recessed to form a pit 1301 in the region corresponding to the recessed part 61. Of course, if the thickness of the first encapsulation layer 13 is large, the surface of the first encapsulation layer 13 away from the substrate 1 can also be roughly flat.

The color filter layer 14 is disposed on a side of the first encapsulation layer 13 away from the second electrode 6, and the color filter layer 14 includes filter regions corresponding to each first electrode 31 one by one. The color filter regions have multiple colors, such as red, blue and green.

The second encapsulation layer 15 may cover the color filter layer 14, and its structure may be the same as that of the first encapsulation layer 13.

The transparent cover plate 16 can cover the second encapsulation layer 15, and its material can be glass or other material.

In addition, in some embodiments of the present disclosure, as shown in FIG. 1, the first type of display panel may further include a light extraction layer 17, which covers the surface of the second electrode 6 away from the substrate 1, and is recessed in an area corresponding to the recessed part

61. Besides, the first encapsulation layer 13 is provided on the side of the light extraction layer 17 away from the substrate 1. The refractive index of the light extraction layer 17 is greater than that of the second electrode 6, which can improve the light extraction efficiency. Besides, the higher the refractive index is, the higher the light extraction efficiency will be.

A Second Display Panel

As shown in FIGS. 7-9, a second display panel of the present disclosure may include a substrate 1, a first insulation layer 2, a first electrode layer 3, a light-emitting function layer 5, and a second electrode 6.

The first insulation layer 2 is provided on a side of the substrate 1.

The first electrode layer 3 is provided on the surface of the first insulation layer 2 facing away from the substrate 1 and includes a plurality of first electrodes 31. The first electrode 31 includes a flat middle part 310 and an edge part 311 surrounding the middle part 310. The edge part 311 includes a flat part 3110 surrounding the middle part 310 and a sloped part 3111 connected between the middle part 310 and the flat part 3110. The thickness of the flat part 3110 is smaller than that of the middle part 310.

The light-emitting function layer 5 covers at least a portion of the middle part 310.

The second electrode 6 covers the light-emitting functional layer 5, and includes a recessed part 61 and a plurality of smooth parts 62 separated by the recessed part 61. The orthographic projection of each smooth part 62 on the first insulation layer 2 is located in a respective first electrode 31 by a one-to-one correspondence. The recessed part 61 is recessed toward the side of the smooth part 62 close to the substrate 1, and the orthographic projection of the recessed part 61 on the first insulation layer 2 is at least partially located outside the middle part 310.

In the display panel according to an embodiment of the present disclosure, each first electrode 31 and its corresponding light-emitting function layer 5 and second electrode 6 can constitute a light-emitting device, which can emit light. By making the orthographic projection of the recessed part 61 of the second electrode 6 on the first insulation layer 2 at least partially located outside the thicker middle part 310 and not directly facing the middle part 310, the risk of sharp discharge between the recessed part 61 and the first electrode 31 can be reduced, which helps to ensure that the light-emitting device emits light stably. At the same time, the light emission across the recessed part 61 can be reduced, thereby reducing the mutual interference of the light emission between adjacent light-emitting devices.

Each part of a second display panel according to an embodiment of the present disclosure will be described in detail below.

In some embodiments of the present disclosure, as shown in FIG. 7, a plurality of driving transistors may be provided on the substrate 1 for driving each light-emitting device to emit light for image display. Taking a driving transistor with a top gate structure as an example, the display panel further includes a gate insulation layer 7, a gate 8, a second insulation layer 9, and a first wiring layer 10. The material of the substrate 1 can be semiconductor materials such as monocrystalline silicon or polysilicon, and the substrate 1 may include an active region 101 and a source 1011 and a drain 1012 located at both ends of the active region 101. The gate insulation layer 7 covers the active region 101. The gate 8 is provided on the surface of the gate insulation layer 7 away from the substrate 1. The second insulation layer 9 covers the gate 8 and the substrate 1, and its material may include at least one of silicon oxide and silicon nitride. The first wiring layer 10 is provided on the surface of the second insulation layer 9 away from the substrate 1, and the gate 8, the source 1011 and the drain 1012 are all connected to the first wiring layer 10 through via holes filled with tungsten or other metals.

In addition, the display panel may further include a third insulation layer 11 and a second wiring layer 12. The third insulation layer 11 covers the first wiring layer 10 and the second insulation layer 9, and the second wiring layer 12 is provided on the surface of the third insulation layer 11 away from the substrate 1. The specific pattern of the second wiring layer 12 is not particularly limited here, and it can be connected to the first wiring layer 10 through via holes filled with tungsten or other metals.

As shown in FIG. 7, the first insulation layer 2 is provided on a side of the substrate 1. In some embodiments of the present disclosure, the first insulation layer 2 can cover the second wiring layer 12, and the first electrode 31 can be connected to the second wiring layer 12 through via holes filled with tungsten or other metals. The material of the first insulation layer 2 may include at least one of silicon nitride and silicon oxide. Of course, it may also include other insulation materials.

As shown in FIG. 7, the first electrode layer 3 is provided on the side of the first insulation layer 2 facing away from the substrate 1, and includes a plurality of first electrodes 31. The first electrodes 31 are arranged in an array, and adjacent first electrodes 31 are arranged at intervals.

In a direction parallel to the substrate 1, each first electrode 31 may include a middle part 310 and an edge part 311 surrounding the middle part 310, wherein the middle part 310 is a flat structure. That is, the middle part 310 is approximately parallel to the surface the first insulation layer 2 away from the substrate 1.

The edge part 311 may include a flat part 3110 and a sloped part 3111, wherein the flat part 3110 is located on the surface of the first insulation layer 2 facing away from the substrate 1 and arranged around the middle part 310, and the flat part 3110 is approximately parallel to the surface of the first insulation layer 2 away from the substrate 1. At the same time, the thickness of the flat part 3110 is smaller than the thickness of the middle part 310. In some embodiments of the present disclosure, there is a non-zero distance between the flat part 3110 and the boundary of the pixel region 202 where it is located. Of course, the boundary of the flat part 3110 may also overlap with the boundary of the pixel region 202.

The sloped part 3111 is connected between the middle part 310 and the flat part 3110. That is, the sloped part 3111 surrounds the middle part 310, and the flat part 3110 is arranged around the sloped part 3111. In some embodiments of the present disclosure, the slope of the sloped part 3111 with relative to the surface of the first insulation layer 2 away from the substrate 1 is not less than 30°, and the slope refers to the angle between the surface of the sloped part 3111 and the surface of the first insulation layer 2 away from the substrate 1.

The first electrode 31 includes a first conductive layer 320, a second conductive layer 321, and a third conductive layer 322. The first conductive layer 320 is provided on the surface of the first insulation layer 2 facing away from the substrate 1, and the second conductive layer 321 is provided on the surface of the first conductive layer 320 away from the substrate 1. The third conductive layer 322 is provided on the surface of the second conductive layer 321 away from the substrate 1, and extends at a certain slope to the surface of the pixel region 202 (where it is located) away from the substrate 1, thereby cladding the first conductive layer 320 and the second conductive layer 321 to protect the first conductive layer 320 and the second conductive layer 321.

The middle part 310 of the first electrode 31 includes an area of the third conductive layer 322 located in the surface of the second conductive layer 321 facing away from the substrate 1, and also includes the first conductive layer 320 and the second conductive layer 321. The edge part 311 includes an area of the third conductive layer 322 cladding the edges of the first conductive layer 320 and the second conductive layer 321, i.e., an area extending toward the first insulation layer 2. Exemplarily, the material of the first conductive layer 320 may include titanium (Ti), the material of the second conductive layer 321 includes silver (Ag), and the material of the third conductive layer 322 includes indium tin oxide (ITO). Of course, it may also be other materials.

As shown in FIG. 7, the light-emitting function layer 5 may be a continuous film layer, and covers simultaneously at least part of the area in each first electrode 31. In some embodiments of the present disclosure, the light-emitting functional layer 5 includes a light-emitting unit layer, and the light-emitting unit layer includes a hole injection layer, a hole transport layer, a light-emitting layer, an electron transport layer, and an electron injection layer that are sequentially stacked from the first electrode 31 in a direction away from the substrate 1.

In another embodiment of the present disclosure, the light-emitting functional layer 5 includes multiple light-emitting unit layers, and the hole injection layer, the hole transport layer, the light-emitting layer, the electron transport layer, and the electron injection layer of each light-emitting unit layer are distributed in the same arrangement. At the same time, a charge generation layer is provided between two adjacent light-emitting unit layers, so that the light-emitting unit layers are connected in series through the charge generation layer, so as to form a series-type OLED light-emitting device.

As shown in FIG. 7, the second electrode 6 covers the light-emitting functional layer 5, and a driving signal can be applied to the first electrode 31 and the second electrode 6, so that a portion of the light-emitting functional layer 5 located between the first electrode 31 and the second electrode 6 emits light. The second electrode 6 includes a plurality of recessed parts 61 and a plurality of smooth parts 62.

The smooth parts 62 are arranged in an array and are arranged in a one-to-one correspondence with the middle part 310 of a respective first electrode 31. That is, the orthographic projection of each smooth part 62 on the first insulation layer 2 is located in a respective first electrode 31 by a one-to-one correspondence. The smooth part 62 is parallel or substantially parallel to the middle part 310.

The recessed part 61 corresponds to the area of the first insulation layer 2 that is not covered by the middle part 310, and is used to separate the smooth parts 62, wherein the recessed part 61 is recessed toward the side of the smooth part 62 close to the substrate 1. The recessed part 61 has a ring structure, and the number is plural, wherein each recessed part 61 surrounds a respective smooth part 62 in a one-to-one correspondence. That is, the recessed part 61 acts as a transition area between two adjacent smooth parts 62.

The orthographic projection of the recessed part 61 on the substrate 1 is at least partially located outside the middle part 310 of the first electrode 31, so as to directly face the area other than the first electrode 31 or the edge part 311 with a smaller thickness, but not directly facing the edge part 311 with a larger thickness. This can reduce the risk of tip discharge and short circuit between the recessed part 61 and the first electrode 31, thereby improving the stability in light emission of the light-emitting device.

In some embodiments of the present disclosure, in a cross-section perpendicular to the substrate 1, the orthographic projection on the first insulation layer 2 of the lowest point of the recessed part 61 is located outside the middle part 310. For example, the lowest point corresponds to one of the sloped part 3111 and the flat part 3110, so as to avoid the occurrence of tip discharge with the middle part 310. The lowest point of the recessed part 61 in the cross section perpendicular to the substrate 1 refers to a point, in the cross section perpendicular to the substrate 1, of the recessed part 61 that is closest to the first electrode 31, that is, farthest from the smooth part 62.

It should be noted that the number of the recessed parts 61 in the cross section perpendicular to the substrate 1 may be plural, and the lowest point in different cross sections may be different. For example, the lowest point may be a point in the depth direction that is nearest to the middle part 310 of the first electrode 31, or some other point in the depth direction, depending on the position of the cross section perpendicular to the substrate 1.

As shown in FIGS. 7-9, in some embodiments of the present disclosure, the recessed part 61 has two side surfaces, including a first side surface 611, a second side surface 612, and a bottom surface 613, wherein the first side surface 611 and the second side surface 612 are arranged oppositely and connected to both sides of the bottom surface 613. At the same time, the first side surface 611 and the second side surface 612 may contract in a direction close to the substrate 1. The first side surface 611 and the second side surface 612 may be curved or flat, and are not specifically limited here.

The bottom surface 613 may be a curved surface that is convex in a direction away from the substrate 1. In some embodiments of the present disclosure, the bottom surface 613 of the recessed part 61 includes a first sloped surface 6131, a second sloped surface 6132, and a connection face 6133. The first sloped surface 6131 and the second sloped surface 6132 can both be curved or flat. The connection face 6133 is located on a side of the bottom sides of the first side surface 611 and the second side surface 612 facing away from the substrate 1, and the connection face 6133 is connected between the first sloped surface 6131 and the second sloped surface 6132. The first sloped surface 6131 is connected to the bottom side of the first side surface 611, and the second sloped surface 6132 is connected to the bottom side of the second side surface 612.

In some embodiments of the present disclosure, the slope of the first sloped surface 6131 with relative to the middle part 310 is not less than the slope of the first side surface 611 with relative to the middle part 310. At the same time, the slope of the second sloped surface 6132 with relative to the middle part 310 is not less than the slope of the second side surface 612 with relative to the middle part 310.

Furthermore, in the cross section perpendicular to substrate 1, the first sloped surface 6131 and the second sloped surface 6132 are symmetrical about the connection face 6133. That is, the cross section of the first sloped surface 6131 perpendicular to the substrate 1 and the cross section of the second slope surface 6132 perpendicular to the substrate 1 are symmetrical with respect to the cross section of the connection face 6133 perpendicular to the substrate 1. At the same time, in the cross section perpendicular to the substrate 1, the first side surface 611 and the second side surface 612 are symmetrical with respect to the bottom surface 613. That is, the cross section of the first side surface 611 perpendicular to the substrate 1 and the cross section of the second side surface 612 perpendicular to the substrate 1 are symmetrical with respect to the cross section of the bottom surface 613 perpendicular to the substrate 1.

In some embodiments of the present disclosure, the minimum thickness of an area of the second electrode 6 corresponding to the first side surface 611 and the second side surface 612 is larger than the minimum thickness of an area of the second electrode 6 corresponding to the first sloped surface 6131 and the second sloped surface 6132.

Further, as shown in FIG. 7, in some embodiments of the present disclosure, the depth of the recessed part 61 is less than twice the maximum thickness of the second electrode 6. For example, the maximum thickness of the second electrode 6 is 90 nm, and the depth of the recessed part 61 is less than 180 nm, such as being 120 nm, 100 nm, 80 nm, 70 nm, 60 nm, 50 nm, 40 nm, etc. The depth of the recessed part 61 refers to the maximum depth of the recessed part 61, that is, in the direction perpendicular to the substrate 1, the distance between a point of the recessed part 61 closest to the substrate 1 and the surface of the smooth part 62 away from the substrate 1.

In some embodiments of the present disclosure, as shown in FIGS. 7 and 8, the orthographic projection of each recessed part 61 on the first insulation layer 2 surrounds the middle part 310 of a first electrode 31, and the minimum value of the distance between the bottom surface 613 of the recessed part 61 and the middle part 310 of the adjacent first electrode 31 (in the direction perpendicular to the substrate 1, the distance between the middle part 310 and a point of the recessed part 61 closest to the middle part 310) is not less than 70% of the total thickness of the smooth part 62 and the light-emitting functional layer 5. The total thickness of the smooth part 62 and the light-emitting functional layer 5 refers to the sum of the thicknesses of the smooth part 62 and the light-emitting functional layer 5. For example, if the total thickness of the smooth part 62 and the light-emitting functional layer 5 is about 365 nm, the minimum value of the distance between the bottom of the recessed part 61 in the direction perpendicular to the substrate 1 and the middle part 310 of the adjacent first electrode 31 is about 255 nm.

Further, the maximum value of the distance between the bottom of the recessed part 61 and the middle part 310 of the adjacent first electrode 31 (in the direction perpendicular to the substrate 1, the maximum value of the distance between the middle part 310 and a point of the recessed part 61 closest to the middle part 310) is not less than 400 nm, and the maximum value is not greater than 450 nm.

As shown in FIG. 7, in order to facilitate formation of the second electrode 6 above, in some embodiments of the present disclosure, a plurality of separation grooves 201 may be provided on the surface of the first insulation layer 2 away from the substrate 1, and the depth of the separation groove 201 is smaller than the thickness of the first insulation layer 2. That is, the separation groove 201 does not penetrate the first insulation layer 2 in the depth direction. A plurality of pixel regions 202 can be divided on the first insulation layer 2 by the separation grooves 201, and the pixel regions 202 are arranged in an array. The specific structure of the separation groove 201 can refer to the above-mentioned first implementation of the display panel, which will not be described in detail here. At the same time, the second display panel according to an embodiment of the present disclosure further includes a pixel definition layer 4, which is made of insulation material, and is provided on the surface of the first insulation layer 2 away from the substrate 1 along with the first electrode layer 3. At the same time, the pixel definition layer 4 exposes at least part of the area of the middle part 310 of the first electrode 31 and is recessed in the area corresponding to the separation groove 201. The middle part 310 exposed by the pixel definition layer 4, together with the corresponding light-emitting function layer 5 and the second electrode 6, can constitute a light-emitting device. The structure of the pixel definition layer 4 can refer to the above-mentioned first implementation of the display panel, which will not be described in detail here.

The light-emitting functional layer 5 also covers the pixel definition layer 4 and the area of the first insulation layer 2 not covered by the pixel definition layer 4 and the first electrode 31. When the light-emitting functional layer 5 is formed by evaporation or other processes, an area of the light-emitting functional layer 5 corresponding to the separation groove 201 is recessed in a direction close to the substrate 1. The orthographic projection on the first insulation layer 2 of the recessed part 61 of the second electrode 6 is at least partially located in the range of the separation groove 201.

In addition, as shown in FIG. 7, the first display panel according to an embodiment of the present disclosure may further include a first encapsulation layer 13. The first encapsulation layer 13 may cover the second electrode 6. For example, the first encapsulation layer 13 may include two inorganic layers and an organic layer between the two inorganic layers. The first encapsulation layer 13 forms a pit 1301 in a region corresponding to the recessed part 61, the two sidewalls of the pit 1301 are narrowed in the direction toward the substrate 1, and the two sidewalls are connected.

In addition, the display panel may further include a color filter layer 14, a second encapsulation layer 15, and a transparent cover plate 16.

The color filter layer 14 is disposed on the side of the first encapsulation layer 13 away from the second electrode 6, and the color filter layer 14 includes filter regions corresponding to each first electrode 31 one by one. The color filter regions have multiple colors, such as red, blue and green.

The second encapsulation layer 15 may cover the color filter layer 14, and its structure may be the same as that of the first encapsulation layer 13.

The transparent cover plate 16 can cover the second encapsulation layer 15, and its material can be glass or other material.

In addition, in some embodiments of the present disclosure, as shown in FIG. 7, the second type of display panel may further include a light extraction layer 17, which covers the surface of the second electrode 6 facing away from the substrate 1 and is recessed in the area corresponding to the recessed part 61. The first encapsulation layer 13 is provided on the side of the light extraction layer 17 away from the substrate 1. The refractive index of the light extraction layer 17 is greater than that of the second electrode 6, which can improve the light extraction efficiency. The higher the refractive index is, the higher the light extraction efficiency will be.

A Third Display Panel

As shown in FIGS. 10 and 11, the display panel may include a substrate 1, a first insulation layer 2, a first electrode layer 3, a pixel definition layer 4, a light-emitting function layer 5, and a second electrode 6.

The first insulation layer 2 is disposed on a side of the substrate 1, and the first insulation layer 2 has a plurality of pixel regions 202 distributed in an array and a separation region 201 that separates the pixel regions 202.

The first electrode layer 3 is provided on the surface of the first insulation layer 2 away from the substrate 1 and includes a plurality of first electrodes 31 distributed in an array. The orthographic projection of each first electrode 31 on the first insulation layer 2 is located in a respective pixel region 202.

The pixel definition layer 4 is provided on the surface of the first insulation layer 2 away from the substrate 1 and exposes the first electrodes 31. The pixel definition layer 4 is formed with a pixel definition groove 41 in an area corresponding to the separation region 201, a middle part of the pixel definition groove 41 has a first protrusion 42 protruding in a direction away from the substrate 1, and a sub-groove 40 is formed between the sidewall of the first protrusion 42 and the sidewall of the pixel definition groove 41.

The light-emitting function layer 5 covers the pixel definition layer 4 and the first electrodes 31 exposed by the pixel definition layer 4.

The second electrode 6 covers the light-emitting function layer 5.

It should be noted that the middle part of the pixel definition groove 41 in this article refers to any area of the bottom surface between the two sidewalls of the pixel definition groove 41, and is not limited to an area between the two sidewalls of the pixel definition groove 41 that is equally distanced to the two sidewalls.

In the display panel according to an embodiment of the present disclosure, the area of each first electrode 31 exposed by the pixel definition layer 4 and the corresponding light-emitting function layer 5 and second electrode 6 can be used to form a light-emitting device for light emission.

Since the orthographic projection of the first electrode 31 on the first insulation layer 2 is located in a respective pixel region 202, the pixel definition groove 41 is located outside the first electrode 31. When the light-emitting function layer 5 is formed, the light-emitting function layer 5 can be recessed toward the substrate at the position of the pixel definition groove, so that the recessed part 61 is formed by the second electrode 6 in such recessed area, and the orthographic projection of the recessed part 61 on the first insulation layer 2 is at least partially within the range of the pixel definition layer 4, at least partly located outside the light-emitting device. Therefore, the position of the recessed part 61 of the second electrode 6 can be restricted by the pixel definition groove 41, so as to prevent tip discharge or even short circuit between the recessed part 61 and the first electrode 31, which is beneficial to ensure a stable light emission from the light-emitting device. At the same time, light emission within the range of the recessed part 61 can be reduced or even avoided, thereby reducing the mutual interference of the light emission between adjacent light-emitting devices.

In addition, since a sub-groove 40 is formed between the first protrusion 42 in the middle part of the pixel definition groove 41 and the sidewall of the pixel definition groove 41, the topography of the middle part of the pixel definition groove 41 is uneven. If the light-emitting function layer 5 contains a charge generation layer, it is difficult for the charge generation layer to be formed on the sidewalls of the two sub-grooves 40, which facilitates to cut off the charge generation layer in the pixel definition groove 41 and avoids crosstalk between two adjacent light-emitting devices. Of course, the sub-groove 40 of the pixel definition groove 41 can also cut off the hole injection layer or other film layers, which can also prevent crosstalk.

Hereinafter, each part of the third display panel according to an embodiment of the present disclosure will be described in detail.

As shown in FIG. 10, the material of the substrate 1 may be a semiconductor material such as monocrystalline silicon or polycrystalline silicon, or other hard or soft materials such as glass.

In some embodiments of the present disclosure, a plurality of driving transistors may be provided on the substrate 1, so as to drive each light-emitting device to emit light to display an image. Taking a driving transistor with a top gate structure as an example, the display panel further includes a gate insulation layer 7, a gate electrode 8, a second insulation layer 9, and a first wiring layer 10. The material of the substrate 1 can be semiconductor materials such as monocrystalline silicon or polysilicon, and the substrate 1 includes an active region 101 and a source 1011 and a drain 1012 located at both ends of the active region 101. The gate insulation layer 7 covers the active region 101. The gate 8 is provided on the surface of the gate insulation layer 7 away from the substrate 1, and the material of the gate 8 may include polysilicon material. The second insulation layer 9 covers the gate 8 and the substrate 1, and its material may include at least one of silicon oxide and silicon nitride. The first wiring layer 10 is provided on the surface of the second insulation layer 9 away from the substrate 1, and the gate 8, the source 1011 and the drain 1012 are all connected to the first wiring layer 10 through via holes filled with tungsten or other metals.

In addition, the display panel may further include a third insulation layer 11 and a second wiring layer 12. The third insulation layer 11 covers the first wiring layer 10 and the second insulation layer 9, and the second wiring layer 12 is provided on the surface of the third insulation layer 11 away from the substrate 1. The specific pattern of the second wiring layer 12 is not particularly limited here, and it can be connected to the first wiring layer 10 through via holes filled with tungsten or other metals.

As shown in FIG. 10, the first insulation layer 2 is provided on a side of the substrate 1. In some embodiments of the present disclosure, the first insulation layer 2 can cover the second wiring layer 12, and the first electrode 31 can be connected to the second wiring layer 12 through the via holes filled with tungsten or other metals. The material of the first insulation layer 2 may include at least one of silicon nitride and silicon oxide, and of course, may also include other insulation materials. For example, the first insulation layer 2 can be planarized by a polishing process.

The first insulation layer 2 can be divided into a plurality of pixel regions 202, which pixel regions 202 are arranged in an array and arranged at intervals. The area other than the driving area 201 is the separation region 201, so that the pixel regions 202 are separated by the separation region 201.

The shape of the orthographic projection of the pixel region 202 on the substrate 1 can be a rectangle, a pentagon, a hexagon or other polygons. Of course, it can also be a circle or other shapes, which is not specifically limited here. At the same time, the shape and size of different pixel regions 202 may be different.

In some embodiments of the present disclosure, for example, the separation region 201 may include a first separation region and a second separation region. The number of the first separation regions is plural, and each first separation region extends linearly along the first direction, but is distributed along the second direction at intervals. The number of the second separation regions is plural, and each second separation region extends linearly along the second direction, but is distributed at intervals along the first direction. The first direction and the second direction intersect each other. For example, the first direction and the second direction are mutually perpendicular directions. In this way, a plurality of pixel regions 202 distributed in an array can be divided on the first insulation layer 2 by the staggered first separation region and the second separation region.

In other embodiments of the present disclosure, the first separation region and the second separation region may also extend along a curved or broken track line, thereby dividing the pixel regions 202 of other shapes.

As shown in FIG. 10, the first electrode layer 3 is provided on the surface of the first insulation layer 2 facing away from the substrate 1, and includes a plurality of first electrodes 31 distributed in an array. The orthographic projections of each first electrode 31 on the first insulation layer 2 are located within a respective pixel region 202 in one-to-one correspondence. That is, the boundary of the orthographic projection of each first electrode 31 on the substrate 1 is located within the boundary of the orthographic projection of a respective pixel region 202 on the substrate 1 in a one-to-one correspondence. Only one first electrode 31 is provided in each pixel region 202. Since the pixel regions 202 are separated by the separation region 201 and the first electrode 31 is located in the pixel region 202, the separation region 201 is located outside the first electrode 31. The shape of the orthographic projection of each first electrode 31 on the first insulation layer 2 may be the same as the shape of the pixel region 202 where it is located, and the boundary of the first electrode 31 is located within the pixel region 202 where it is located.

In a direction parallel to the substrate 1, at least one first electrode 31 may include a middle part 310 and an edge part 311 surrounding the middle part 310, wherein the middle part 310 is a flat structure. That is, the middle part 310 is approximately parallel to the surface of the first insulation layer 2 away from the substrate 1.

In some embodiments of the present disclosure, the boundary of the orthographic projection of the middle part 310 of each first electrode 31 on the substrate 1 may be located within the boundary of the orthographic projection of the pixel region 202 (where it is located) on the substrate 1. That is, the distance L between the boundary of the orthographic projection of the middle part 310 on the substrate 1 and the boundary of the orthographic projection of the pixel region 202 (where it is located) on the substrate 1 is not zero. Further, the distance L is not less than 0.15 μm. For example, the distance L may be 0.15 μm, 0.2 μm, 0.25 μm, or the like.

The edge part 311 may include a flat part 3110 and a sloped part 3111, wherein the flat part 3110 is located on the surface of the first insulation layer 2 facing away from the substrate 1 and arranged around the middle part 310. The flat part 3110 is approximately parallel to the surface of the first insulation layer 2 away from the substrate 1. At the same time, the thickness of the flat part 3110 is smaller than the thickness of the middle part 310. In some embodiments of the present disclosure, a non-zero distance exists between the boundary of the orthographic projection of the flat part 3110 on the substrate 1 and the boundary of the orthographic projection of the pixel region 202 (where it is located) on the substrate 1. Of course, the boundary of the orthographic projection of the flat part 3110 on the substrate 1 overlaps with the boundary of the orthographic projection of the pixel region 202 (where it is located) on the substrate 1.

The sloped part 3111 is connected between the middle part 310 and the flat part 3110. That is, the sloped part 3111 surrounds the middle part 310, and the flat part 3110 is arranged around the sloped part 3111. In some embodiments of the present disclosure, the slope of the sloped part 3111 with relative to the surface of the first insulation layer 2 away from the substrate 1 is not less than 30°, and the slope refers to the angle between the surface of the sloped part 3111 and the surface of the first insulation layer 2 away from the substrate 1.

The first electrode 31 may include a first conductive layer 320, a second conductive layer 321, and a third conductive layer 322. The first conductive layer 320 is provided on the surface of the first insulation layer 2 away from the substrate 1, and the second conductive layer 321 is provided on the surface of the first conductive layer 320 away from the substrate 1. The third conductive layer 322 is provided on the surface of the second conductive layer 321 away from the substrate 1, and extends to the first insulation layer 2 at a certain slope, thereby cladding the first conductive layer 320 and the second conductive layer 321 to protect the first conductive layer 320 and the second conductive layer 321.

The middle part 310 of the first electrode 31 includes an area of the third conductive layer 322 located in the surface of the second conductive layer 321 facing away from the substrate 1, and also includes the first conductive layer 320 and the second conductive layer 321. The edge part 311 includes an area of the third conductive layer 322 cladding the edges of the first conductive layer 320 and the second conductive layer 321, i.e., an area extending toward the first insulation layer 2. Exemplarily, the material of the first conductive layer 320 may include titanium (Ti), the material of the second conductive layer 321 includes silver (Ag), and the material of the third conductive layer 322 includes indium tin oxide (ITO). Of course, it may also be other materials.

As shown in FIG. 10, the pixel definition layer 4 is made of insulation material, and is provided on the surface of the first insulation layer 2 away from the substrate 1 along with the first electrode layer 3, and exposes at least part of the first electrode 31.

For example, the pixel definition layer 4 is provided with a plurality of openings 401 each exposing at least a portion of a respective middle part 310 in a one-to-one correspondence. The first electrode 31 exposed by the pixel definition layer 4, together with the corresponding light-emitting function layer 5 and the second electrode 6, can form a light-emitting device. In some embodiments of the present disclosure, the opening 401 of the pixel definition layer 4 may have a hexagonal or other polygonal structure. The first electrode 31 may also have a polygonal structure, and has the same shape as the opening 401. Of course, the first electrode 31 can also be other shapes. For details, reference may be made to the implementations of the first display panel in FIG. 5 and FIG. 6.

As shown in FIG. 10, the pixel definition layer 4 is formed with a pixel definition groove 41 in a region corresponding to the separation region 201, and the pixel definition groove 41 can be formed by a photolithography process when the pixel definition layer 4 is formed. Of course, the pixel definition layer 4 can be recessed at the separation groove by providing a separation groove in the separation region 201 of the first insulation layer 2, so as to form the pixel definition groove 41.

In some embodiments of the present disclosure, the pixel definition layer 4 may include a spacing part 400 and an extension part 410, wherein the spacing part 400 is located in an area of the first insulation layer 2 not covered by the first electrode 31, that is, located in an area other than the first electrode 31. The pixel definition groove 41 is provided in the spacing part 400. The extension part 410 is connected to the spacing part 400, extends to the surface of the first electrode 31 facing away from the substrate 1, and does not completely cover the first electrode 31. For example, the extension part 410 extends along the circumferential direction of the first electrode 31 to the surface of the circumferential direction of the middle part 310 away from the substrate 1, and does not completely cover the middle part 310, so as to form an opening 401.

Further, the width of the extension part 410 covering any one of the first electrodes 31 is smaller than the width of the spacing part 400 between two adjacent first electrodes 31. That is to say, for any first electrode 31, the area of the extension part 410 located on the surface of the first electrode 31 facing away from the substrate 1 has a ring structure, and the width of the ring structure is smaller than the width of the spacing part 400 adjacent to the first electrode 31, wherein the width of the ring structure refers to the distance between the two sidewalls of the ring structure.

Based on the above-mentioned pixel definition layer 4, the middle part of the pixel definition groove 41 may have a first protrusion 42 protruding in a direction away from the substrate 1, and a sub-groove 40 is formed between the sidewall of the first protrusion 42 and the sidewall of the pixel definition groove 41. Compared with the case where the middle part of the pixel definition groove 41 is flat, the first protrusion 42 can provide the middle part of the pixel definition groove 41 with a more complicated topography, which is beneficial to cut off the charge generation layer or other film layers of the upper light-emitting functional layer 5, preventing crosstalk between adjacent light-emitting devices.

It should be noted that the middle part of the sub-groove 40 herein refers to any area of the bottom surface between the two sidewalls of the sub-groove 40, and is not limited to an area between the two sidewalls of the sub-slot 40 that has an equal distance to the two sidewalls.

In some embodiments of the present disclosure, the two sidewalls of the first protrusion 42 are inclined surfaces that expand toward the substrate 1, and the two sidewalls of the pixel definition groove 41 are inclined surfaces that contract toward the substrate 1. That is, the distance between the two sidewalls of the first protrusion 42 gradually increases toward the substrate 1, and the distance between the two sidewalls of the pixel definition groove 41 gradually decreases toward the substrate 1. Thus, the sub-groove 40 is a groove whose two sidewalls contract toward the substrate 1.

Further, the slope of the sidewall of the first protrusion 42 is different from the slope of the sidewall of the pixel definition groove 41. The slope of the sidewall of the first protrusion 42 is the angle between the sidewall of the first protrusion 42 and the surface of the first insulation layer 2 away from the substrate 1, and the slope of the sidewall of the pixel definition groove 41 is the angle between the sidewall of the pixel definition groove 41 and the surface of the first insulation layer 2 away from the substrate 1. If the sidewall of the first protrusion 42 and the sidewall of the pixel definition groove 41 are arc surfaces, the slope for each of the two is a maximum or average value of the angle between the section of the respective arc surface and the surface of the first insulation layer 2 away from the substrate 1.

Further, the thickness of the first protrusion 42 may be less than the depth of the pixel definition groove 41, so that the first protrusion 42 does not protrude from the surface of the first insulation layer 2 away from the substrate 1, but is completely located within the pixel definition groove 41.

As shown in FIG. 10, the light-emitting functional layer 5 may be a continuous film layer, and at least partially covers the middle part 310 of each first electrode 31, that is, covers the area exposed by the opening 401. At the same time, the light-emitting functional layer 5 may also cover at least part of the pixel definition layer 4. When the light-emitting functional layer 5 is formed by evaporation or other processes, and the light-emitting functional layer 5 is recessed along a direction toward the substrate 1 in the area corresponding to the pixel definition groove 41.

In an embodiment of the present disclosure, as shown in FIG. 11, the light-emitting function layer 5 includes a multi-layer light-emitting unit layer 501, and the hole injection layer, the hole transport layer, the light-emitting layer, the electron transport layer and the electron injection layer of each light-emitting unit layer 501 have the same way of distribution. At the same time, a charge generation layer 502 is provided between two adjacent light-emitting unit layers 501, so that the light-emitting unit layers 501 are connected in series through the charge generation layer 502, so as to form a series-type OLED light-emitting device.

In some other embodiments of the present disclosure, the light-emitting function layer 5 includes a light-emitting unit layer, and the light-emitting unit layer includes a hole injection layer, a hole transport layer, a light-emitting layer, an electron transport layer, and an electron injection layer which are sequentially stacked from the first electrode 31 in a direction away from the substrate 1.

The charge generation layer 502 is difficult to cover the sidewalls of the sub-groove 40 of the pixel definition groove 41, so that the charge generation layer 502 of the light-emitting device can be cut off by the pixel definition groove 41, so as to avoid crosstalk between two adjacent light-emitting devices. Of course, the pixel definition groove 41 can also cut off the hole injection layer or other film layers, which can also prevent crosstalk.

It should be noted that the light-emitting functional layer 5 is a continuous film layer, but not every film layer is a continuous film layer. For example, in some embodiments of the present disclosure, the light-emitting layer of the light-emitting function layer 5 may include a plurality of light-emitting parts distributed at intervals, and each light-emitting part is located in an opening 401, so that each light-emitting device has an independent light-emitting part. The materials of different light-emitting parts can be different, so that the light-emitting colors of different light-emitting devices can be different. The other film layers of the light-emitting function layer 5 can be the aforementioned continuous film layers, meaning that each light-emitting device can share these continuous film layers.

As shown in FIG. 10, the second electrode 6 covers the light-emitting functional layer 5, and a driving signal can be applied to the first electrode 31 and the second electrode 6, so that the portion of the light-emitting functional layer 5 located between the first electrode 31 and the second electrode 6 emits light.

There is a certain distance between the second electrode 6 and the first electrode 31, so that a microcavity can be formed. The light emitted by the light-emitting function layer 5 will be reflected to a certain extent at the first electrode 31 and the second electrode 6. When the light wavelength and the depth of the microcavity meet the resonance condition, the light is strengthened according to the principle of constructive interference, which is beneficial to improve the brightness of the light-emitting device. However, due to the different wavelengths of light of different colors, the depth of the microcavity of light-emitting devices with different light-emitting colors may be different.

In some embodiments of the present disclosure, the light-emitting colors of the light-emitting layers in different light-emitting devices may be different. In order for the microcavity to have the same enhancement effect on light of different colors, the thickness of the first electrode 31 in the light-emitting devices of different light-emitting colors may be different, so that the depth of the microcavity matches with the wavelength of the light, meaning that the longer the wavelength of light emission is, the greater the depth of the microcavity will be. Further, the first electrode 31 includes a first conductive layer 320, a second conductive layer 321, and a third conductive layer 322. The first conductive layer 320 may be a reflective material, and the depth of the microcavity may be the distance between the first conductive layer 320 and the electrodes 6. The thickness of the first conductive layer 320 of the two first electrodes 31 can be different, while the thickness of the second conductive layer 321 is the same, and the thickness of the third conductive layer 322 is also the same, so that the thicknesses of the two first electrodes 31 are different.

The morphology of the second electrode 6 matches with that of the light-emitting functional layer 5, which is recessed in the recessed area of the light-emitting functional layer 5 to form a recessed part 61, and a smooth part 62 is formed in the region corresponding to the middle part 310 of the first electrode 31. The orthographic projection of the recessed part 61 on the first insulation layer 2 is at least partially located outside the middle part 310 of the first electrode 31, so as to reduce or avoid the tip discharge between the first electrode 31 and the recessed part 61 of the second electrode 6. The material of the second electrode 6 may be an alloy material. For example, the material of the second electrode 6 may include Mg and Ag. Alternatively, the second electrode 6 may also be an alloy of Al and Li. Of course, the second electrode 6 can also use other alloys or elemental metals, which will not be listed here.

In some embodiments of the present disclosure, the extension part 410 of the pixel definition layer 4 covers the edge of the middle part 310, and the second electrode 6 may protrude in a direction away from the substrate 1 in the region corresponding to the extension part 410, but is protruding to a height that is smaller than the thickness of the middle part 310, so that the junction part between the smooth part 62 and the recessed part 61 is generally smooth.

Further, as shown in FIGS. 10 and 11, in some embodiments of the present disclosure, the lowest point of the recessed part 61 of the second electrode 6 in the cross section perpendicular to the substrate 1 has an orthographic projection on the first insulation layer 2, which orthographic projection is completely located inside the pixel definition groove 41, that is, completely located outside the middle part 310.

In addition, in some embodiments of the present disclosure, as shown in FIGS. 10 and 11, the third type of display panel may further include a first encapsulation layer 13, a color filter layer 14, a second encapsulation layer 15, and a transparent cover plate 16.

The first encapsulation layer 13 may cover the second electrode 6. For example, the first encapsulation layer 13 may include two inorganic layers and an organic layer between the two inorganic layers.

In some embodiments of the present disclosure, the first encapsulation layer 13 may be recessed to form a pit 1301 in the region corresponding to the recessed part 61. Of course, if the thickness of the first encapsulation layer 13 is large, the surface of the first encapsulation layer 13 away from the substrate 1 can also remain substantially flat.

Further, the color filter layer 14 is disposed on the side of the first encapsulation layer 13 away from the second electrode 6, and the color filter layer 14 includes filter regions corresponding to each first electrode 31 one by one. The color filter regions have multiple colors, such as red, blue and green.

The second encapsulation layer 15 may cover the color filter layer 14, and its structure may be the same as that of the first encapsulation layer 13.

The transparent cover plate 16 can cover the second encapsulation layer 15, and its material can be glass or other material.

In addition, in some embodiments of the present disclosure, as shown in FIGS. 10 and 11, the third display panel may further include a light extraction layer 17, which covers the surface of the second electrode 6 facing away from the substrate 1 and is recessed in the area corresponding to the recessed part 61. The first encapsulation layer 13 is provided on the side of the light extraction layer 17 away from the substrate 1. The refractive index of the light extraction layer 17 is greater than that of the second electrode 6, which can improve the light extraction efficiency. The higher the refractive index is, the higher the light extraction efficiency will be.

A Fourth Display Panel

As shown in FIGS. 12 and 13, the display panel may include a substrate 1, a first insulation layer 2, a first electrode layer 3, a pixel definition layer 4, a light-emitting function layer 5, and a second electrode 6.

The first insulation layer 2 is provided on a side of the substrate 1.

The first electrode layer 3 is disposed on the surface of the first insulation layer 2 away from the substrate 1 and includes a plurality of first electrodes 31 distributed in an array.

The pixel definition layer 4 is disposed on the surface of the first insulation layer 2 away from the substrate 1 and exposes the first electrodes 31.

The light-emitting function layer 5 covers the pixel definition layer 4 and the first electrode 31 and the first insulation layer 2 exposed by the pixel definition layer 4.

The second electrode 6 covers the light-emitting functional layer 5, and includes a recessed part 61 and a plurality of smooth parts 62 separated by the recessed part 61. The orthographic projection of each smooth part 62 on the first insulation layer 2 is located in a respective first electrode 31. At least a portion of the recessed part 61 is recessed toward the side of the smooth part 62 close to the substrate 1. The orthographic projection of the recessed part 61 on the first insulation layer 2 is at least partially located in the pixel definition groove 41. A second protrusion 600 is provided at a position, corresponding to the first protrusion 42, of the middle part of the recessed part 61, and a sub-recess 610 is formed between the side surface of the second protrusion 600 and the side surface of the recessed part 61.

It should be noted that the middle part of the recessed part 61 in this text refers to any area of the bottom surface between the two sidewalls of the recessed part 61, and is not limited to an area between the two sidewalls of the recessed part 61 that has an equal distance to the two sidewalls.

In the display panel according to an embodiment of the present disclosure, the area of each first electrode 31 exposed by the pixel definition layer 4 and the corresponding light-emitting function layer 5 and second electrode 6 can constitute a light-emitting device to emit light. Since the orthographic projection of the recessed part 61 of the second electrode 6 on the first insulation layer 2 is at least partially located outside the first electrode, it can prevent a sharp discharge or even a short circuit generated between the recessed part 61 and the first electrode 31, which is beneficial to ensure a stable light emission by the light-emitting device. At the same time, light emission within the range of the recessed part 61 can be reduced or even avoided, thereby reducing the mutual interference of the light emission between adjacent light-emitting devices.

Hereinafter, each part of the fourth display panel according to an embodiment of the present disclosure will be described in detail.

As shown in FIG. 12 and FIG. 13, in some embodiments of the present disclosure, a plurality of driving transistors may be provided on the substrate 1, for driving each light-emitting device to emit light for image display. Taking a driving transistor with a top gate structure as an example, the display panel further includes a gate insulation layer 7, a gate 8, a second insulation layer 9 and a first wiring layer 10. The material of the substrate 1 can be semiconductor materials such as monocrystalline silicon or polysilicon, and the substrate 1 includes an active area 101 and a source 1011 and a drain 1012 located at both ends of the active area 101. The gate insulation layer 7 covers the active area 101. The gate 8 is provided on the surface of the gate insulation layer 7 away from the substrate 1, and the material of the gate 8 may include polysilicon material. The second insulation layer 9 covers the gate 8 and the substrate 1, and its material may include at least one of silicon oxide and silicon nitride. The first wiring layer 10 is provided on the surface of the second insulation layer 9 away from the substrate 1, and the gate 8, the source 1011 and the drain 1012 are all connected to the first wiring layer 10 through via holes filled with tungsten or other metals.

In addition, the display panel may further include a third insulation layer 11 and a second wiring layer 12. The third insulation layer 11 covers the first wiring layer 10 and the second insulation layer 9, and the second wiring layer 12 is provided on the surface of the third insulation layer 11 away from the substrate 1. The specific pattern of the second wiring layer 12 is not particularly limited here, and it can be connected to the first wiring layer 10 through via holes filled with tungsten or other metals.

As shown in FIGS. 12 and 13, the first insulation layer 2 is provided on a side of the substrate 1. In some embodiments of the present disclosure, the first insulation layer 2 can cover the second wiring layer 12, and the first electrode 31 may be connected to the second wiring layer 12 through vias filled with tungsten or other metals. The material of the first insulation layer 2 may include at least one of silicon nitride and silicon oxide, and of course, may also include other insulation materials. For example, the first insulation layer 2 can be planarized by a polishing process.

The first insulation layer 2 has a separation region 201 through which a plurality of pixel regions 202 can be separated on the first insulation layer 2, and the pixel regions 202 are arranged in an array.

As shown in FIGS. 12 and 13, the first electrode layer 3 is provided on the surface of the first insulation layer 2 away from the substrate 1 and includes a plurality of first electrodes 31 distributed in an array.

In some embodiments of the present disclosure, the orthographic projection of each first electrode 31 on the first insulation layer 2 is located within a respective pixel region 202 in a one-to-one correspondence. That is, the boundary of the orthographic projection of each first electrode 31 on the substrate 1 is located within the boundary of the orthographic projection of a respective pixel region 202 on the substrate 1 in a one-to-one correspondence. Only one first electrode 31 is provided in each pixel region 202. Since the pixel regions 202 are separated by the separation region 201 and the first electrode 31 is located in the pixel region 202, the separation region 201 is located outside the first electrode 31. The shape of the orthographic projection of each first electrode 31 on the first insulation layer 2 may be the same as the shape of the pixel region 202 where it is located, and the boundary of the first electrode 31 is located within the pixel region 202 where it is located.

In a direction parallel to the substrate 1, at least one first electrode 31 may include a middle part 310 and an edge part 311 surrounding the middle part 310, wherein the middle part 310 is a flat structure. That is, the middle part 310 is approximately parallel to the surface of the first insulation layer 2 away from the substrate 1.

In some embodiments of the present disclosure, the boundary of the orthographic projection of the middle part 310 of each first electrode 31 on the substrate 1 may be located within the boundary of the orthographic projection of the pixel region 202 (where it is located) on the substrate 1. That is, the boundary of the orthographic projection of the middle part 310 on the substrate 1 and the boundary of the orthographic projection of the pixel region 202 (where it is located) on the substrate 1 have a distance L that is not zero. Further, the distance L is not less than 0.15 μm. For example, the distance L may be 0.15 μm, 0.2 μm, 0.25 μm, or the like.

The edge part 311 may include a flat part 3110 and a sloped part 3111, wherein the flat part 3110 is located on the surface of the first insulation layer 2 facing away from the substrate 1 and arranged around the middle part 310. The flat part 3110 is approximately parallel to the surface of the first insulation layer 2 away from the substrate 1. At the same time, the thickness of the flat part 3110 is smaller than the thickness of the middle part 310. In some embodiments of the present disclosure, there is a non-zero distance between the boundary of the orthographic projection of the flat part 3110 on the substrate 1 and the boundary of the orthographic projection of the pixel region 202 (where it is located) on the substrate 1. Of course, the boundary of the orthographic projection of the flat part 3110 on the substrate 1 overlaps with the boundary of the orthographic projection of the pixel region 202 (where it is located) on the substrate 1.

The sloped part 3111 is connected between the middle part 310 and the flat part 3110. That is, the sloped part 3111 surrounds the middle part 310, and the flat part 3110 is arranged around the sloped part 3111. In some embodiments of the present disclosure, the slope of the sloped part 3111 with relative to the surface of the first insulation layer 2 away from the substrate 1 is not less than 30°, and the slope refers to the angle between the surface of the sloped part 3111 and the surface of the first insulation layer 2 away from the substrate 1.

As shown in FIGS. 12 and 13, the first electrode 31 may include a first conductive layer 320, a second conductive layer 321, and a third conductive layer 322. The first conductive layer 320 is disposed on the surface of the first insulation layer 2 away from the substrate 1. The second conductive layer 321 is provided on the surface of the first conductive layer 320 away from the substrate 1. The third conductive layer 322 is provided on the surface of the second conductive layer 321 away from the substrate 1, extends to the first insulation layer at a certain slope, and clades the first conductive layer 320 and the second conductive layer 321 to protect the first conductive layer 320 and the second conductive layer 321.

The middle part 310 of the first electrode 31 includes an area of the third conductive layer 322 located on the surface of the second conductive layer 321 facing away from the substrate 1, and also includes the first conductive layer 320 and the second conductive layer 321. The edge part 311 includes an area of the third conductive layer 322 cladding the edges of the first conductive layer 320 and the second conductive layer 321, i.e., an area extending toward the first insulation layer 2. Exemplarily, the material of the first conductive layer 320 may include titanium (Ti), the material of the second conductive layer 321 includes silver (Ag), and the material of the third conductive layer 322 includes indium tin oxide (ITO). Of course, it may also be other materials.

As shown in FIG. 12 and FIG. 13, the pixel definition layer 4 is made of insulation material, and is provided on the surface of the first insulation layer 2 away from the substrate 1 along with the first electrode layer 3, and exposes at least a part of the first electrode 31.

For example, the pixel definition layer 4 is provided with a plurality of openings 401, each opening exposing at least a part of a respective middle part 310 in a one-to-one correspondence. The first electrode 31 exposed by the pixel definition layer 4 can form a light-emitting device along with the corresponding light-emitting function layer 5 and second electrode 6. In some embodiments of the present disclosure, the opening 401 of the pixel definition layer 4 may have a hexagonal or other polygonal structure, and the first electrode 31 may also have a polygonal structure and have the same shape as the opening 401. Of course, the first electrode 31 may also have other shapes. For details, please refer to the first type of display panel shown in FIG. 5 and FIG. 6.

As shown in FIGS. 12 and 13, the pixel definition layer 4 is formed with a pixel definition groove 41 in an area corresponding to the separation region 201.

Based on the above-mentioned pixel definition layer 4, the middle part of the pixel definition groove 41 may have a first protrusion 42 protruding in a direction away from the substrate 1, and a sub-groove 40 is formed between the sidewall of the first protrusion 42 and the sidewall of the pixel definition groove 41. Compared with the case where the middle part of the pixel definition groove 41 is flat, the first protrusion 42 can provide the middle part of the pixel definition groove 41 with a more complicated topography, which is beneficial to cut off the charge generation layer or other film layers of the upper light-emitting functional layer 5 and prevent crosstalk between adjacent light-emitting devices. Further, in order to ensure that the pixel definition groove 41 has a sufficient depth to cut off some of the upper film layers, the middle part of the pixel definition groove 41 can be located in the separation region 201. That is, one or more point of the pixel definition groove 41 closest to the substrate 1 is located on the side of the first insulation layer 2 facing away from the substrate 1. Correspondingly, the middle part of the sub-groove 40 is located in the separation region 201.

The detailed structure of the pixel definition layer 4 and the pixel definition groove 41 can refer to the above-mentioned implementation of the third display panel, which will not be described in detail here.

As shown in FIGS. 12 and 13, the light-emitting functional layer 5 can be a continuous film layer, and at least partially covers the middle part 310 of each first electrode 31, that is, covers the area exposed by the opening 401. At the same time, the light-emitting functional layer 5 also covers the pixel definition layer 4 and the area of the first insulation layer 2 not covered by the pixel definition layer 4 and the first electrode 31. When the light-emitting function layer 5 is formed by evaporation or other processes, the light-emitting function layer 5 is recessed toward the substrate 1 in an area corresponding to the pixel definition groove 41.

In an embodiment of the present disclosure, referring to the light-emitting functional layer 5 of the third display panel, as shown in FIG. 10, the light-emitting functional layer 5 includes a multilayer light-emitting unit layer 501, wherein the hole injection layer, the hole transport layer, the light-emitting layer, the electron transport layer, and the electron injection layer of each light-emitting unit layer 501 are the same in distribution. At the same time, a charge generation layer 502 is provided between two adjacent light-emitting unit layers 501, so that the light-emitting unit layers 501 are connected in series through the charge generation layer 502, so as to form a series-type OLED light-emitting device.

In some other embodiments of the present disclosure, the light-emitting function layer 5 includes a light-emitting unit layer, wherein the light-emitting unit layer includes a hole injection layer, a hole transport layer, a light-emitting layer, an electron transport layer, and an electron injection layer which are sequentially stacked from the first electrode 31 in a direction away from the substrate 1.

The charge generation layer 502 is difficult to cover the sidewalls of the sub-groove 40 of the pixel definition groove 41, so that the charge generation layer 502 of the light-emitting device can be cut off by the pixel definition groove 41, so as to avoid crosstalk between two adjacent light-emitting devices. Of course, the pixel definition groove 41 can also cut off the hole injection layer or other film layers, which can also prevent crosstalk.

As shown in FIGS. 12 and 13, the second electrode 6 covers the light-emitting function layer 5, and includes a recessed part 61 and a plurality of smooth parts 62 separated by the recessed part 61. The orthographic projection of each smooth part 62 on the first insulation layer 2 is positioned in a respective first electrode 31 in a one-to-one correspondence. The recessed part 61 is recessed toward the side of the smooth part 62 close to the substrate 1, and the orthographic projection of the recessed part 61 on the first insulation layer 2 is at least partially located outside the first electrode 31. A second protrusion 600 is provided in the middle part of the recessed part 61, and a sub-recess 610 is formed between the side surface of the second protrusion 600 and the side surface of the recessed part 61.

In some embodiments of the present disclosure, the orthographic projection of the recessed part 61 on the first insulation layer 2 is at least partially located in the pixel definition groove 41. Further, a second protrusion 600 is provided at a position in the middle part of the recessed part 61 corresponding to the first protrusion 42, and a sub-recess 610 is formed between the side surface of the second protrusion 600 and the side surface of the recessed part 61. The orthographic projection on the first insulation layer 2 of a point of the sub-recess 610 closest to the substrate 1 is located in the sub-groove 40.

The smooth parts 62 are arranged in an array and are arranged in a one-to-one correspondence to the middle part 310 of a respective first electrode 31. That is, the orthographic projection of each smooth part 62 on the first insulation layer 2 is located within a respective first electrode 31 in a one-to-one correspondence. The smooth part 62 is parallel or substantially parallel to the middle part 310.

The recessed part 61 corresponds to the area of the first insulation layer 2 that is not covered by the middle part 310, and is used to separate the smooth parts 62. The recessed part 61 is recessed toward the side of the smooth part 62 close to the substrate 1. The recessed part 61 has a ring structure, and the number is plural. Each recessed part 61 surrounds a respective smooth part 62 in a one-to-one correspondence. That is, the recessed part 61 is a transition area between two adjacent smooth parts 62.

The orthographic projection of the recessed part 61 on the substrate 1 is at least partially located outside the middle part 310 of the first electrode 31, so as to directly face the area other than the first electrode 31 or the edge part 311 with a smaller thickness, but not directly face the edge part 311 with a larger thickness. This can reduce the risk of tip discharge and short circuit between the recessed part 61 and the first electrode 31, thereby improving the stability of the light-emitting device.

In some embodiments of the present disclosure, on a cross section perpendicular to the substrate 1, the orthographic projection of the lowest point of the recessed part 61 on the first insulation layer 2 is located outside the middle part 310. For example, the lowest point corresponds to one of the sloped part 3111 and the flat part 3110, so as to avoid the occurrence of tip discharge between the flat part 310 and the lowest point. The lowest point of the recessed part 61 on the cross section perpendicular to the substrate 1 refers to a point of the recessed part 61 which point is, on the cross section perpendicular to the substrate 1, closest to the first electrode 31, that is, farthest from the smooth part 62.

It should be noted that the number of recessed part 61 in the section perpendicular to the substrate 1 may be plural, and the lowest point on different sections may be different. For example, the lowest point may be a point that is closest to the middle part of the first electrode 31 in the depth direction, or another point in the depth direction, depending on the position of the cross section perpendicular to the substrate 1.

As shown in FIGS. 12 and 13, in some embodiments of the present disclosure, the recessed part 61 has two side surfaces, including a first side surface 611, a second side surface 612, and a second protrusion 600, wherein the first side surface 611 and the second side surface 612 are oppositely disposed and connected to both sides of the second protrusion 600. At the same time, the first side surface 611 and the second side surface 612 may contract in a direction approaching the substrate 1. The first side surface 611 and the second side surface 612 may be curved or flat, and are not specifically limited here.

The second protrusion 600 may be a curved surface that is convex in a direction away from the substrate 1. In some embodiments of the present disclosure, the second protrusion 600 includes a first sloped surface 6131, a second sloped surface 6132, and a connection face 6133. The first sloped surface 6131 and the second sloped surface 6132 can both be curved or flat. The connection face 6133 is located on the side of the bottom sides of the first side surface 611 and the second side surface 612 facing away from the substrate 1, and the connection face 6133 is connected to between the first sloped surface 6131 and the second sloped surface 6132. The first sloped surface 6131 is connected to the bottom side of the first side surface 611 to form a sub-recess 610, and the second sloped surface 6132 is connected to the bottom side of the second side surface 612 to form another sub-recess 610.

In some embodiments of the present disclosure, the slope of the first sloped surface 6131 with relative to the middle part 310 is not less than the slope of the first side surface 611 with relative to the middle part 310. At the same time, the slope of the second sloped surface 6132 with relative to the middle part 310 is not less than the slope of the second side surface 612 with relative to the middle part 310.

In some embodiments of the present disclosure, the minimum thickness of the area of the second electrode 6 corresponding to the first side surface 611 and the second side surface 612 is larger than the minimum thickness of the area of the second electrode 6 corresponding to the first sloped surface 6131 and the second sloped surface 6132.

Further, as shown in FIGS. 12 and 13, in some embodiments of the present disclosure, the depth of the recessed part 61 is less than twice the maximum thickness of the second electrode 6. For example, the maximum thickness of the second electrode 6 is 90 nm. The depth of the recessed part 61 is less than 180 nm, such as being 120 nm, 100 nm, 80 nm, 70 nm, 60 nm, 50 nm, 40 nm, etc. The depth of the recessed part 61 refers to the maximum depth of the recessed part 61, that is, a distance, in the direction perpendicular to the substrate 1, between the point of the recessed part 61 closest to the substrate 1 and the surface of the smooth part 62 away from the substrate 1.

In some embodiments of the present disclosure, as shown in FIGS. 12 and 13, the orthographic projection of each recessed part 61 on the first insulation layer 2 surrounds the middle part 310 of a respective first electrode 31. The minimum value of the distance between the second protrusion 600 of the recessed part 61 and the middle part 310 of the adjacent first electrode 31 (in the direction perpendicular to the substrate 1, the distance between the middle part 310 and the point of the recessed part 61 nearest to the middle part 310) is not less than 70% of the total thickness of the smooth part 62 and the light-emitting functional layer 5, wherein the total thickness of the smooth part 62 and the light-emitting functional layer 5 is the sum of the thicknesses of the smooth part 62 and the light-emitting functional layer 5. For example, the total thickness of the smooth part 62 and the light-emitting functional layer 5 is about 365 nm. In this case, the minimum value of the distance between the middle part of the recessed part 61 in the direction perpendicular to the substrate 1 and the middle part 310 of the adjacent first electrode 31 is about 255 nm.

Further, the maximum value of the distance between the middle part of the recessed part 61 and the middle part 310 of the adjacent first electrode 31 (in the direction perpendicular to the substrate 1, the maximum value of the distance between the middle part 310 and the point closest to the middle part 310 of the recessed part 61) is not less than 400 nm, and the maximum value is not greater than 450 nm.

As shown in FIGS. 12 and 13, in some embodiments of the present disclosure, the pixel definition layer 4 may include a spacing part 400 and an extension part 410, wherein the spacing part 400 is located in an area of the first insulation layer 2 which is not covered by the first electrode 31, i.e., outside the first electrode 31, and the pixel definition groove 41 is provided in the spacing part 400. The extension part 410 is connected to the spacing part 400, extends to the surface of the first electrode 31 facing away from the substrate 1, and does not completely cover the first electrode 31. For example, the extension part 410 extends along the circumferential direction of the first electrode 31 to the surface of the circumferential direction of the middle part 310 away from the substrate 1, and does not completely cover the middle part 310.

Since the extension part 410 covers the boundary of the first electrode 31, such that the second electrode 6 corresponding to the area of the extension part 410 also has a protrusion part 63 that protrudes in a direction away from the substrate 1, the smooth part 62 is connected to the recessed part 61 through the protrusion part 63. The orthographic projection of the protrusion part 63 on the substrate 1 at least partially overlaps with the orthographic projection of the extension part 410 on the substrate 1.

If the thicknesses of two adjacent first electrodes 31 are different, and the distances between the substrate 1 and the surfaces of the extension parts 410 of the two first electrodes 31 facing away from the substrate 1 are different, such that among the two protrusions 63 connected to the two sides of a respective recessed part 61, the distance between the substrate 1 and the point of one protrusion 63 furthest from the substrate 1 is different from the distance between the substrate 1 and the point of the other protrusion 63 furthest from the substrate 1.

In addition, as shown in FIGS. 12 and 13, the display panel may further include a first encapsulation layer 13, a color filter layer 14, a second encapsulation layer 15, and a transparent cover plate 16.

The first encapsulation layer 13 may cover the second electrode 6. For example, the first encapsulation layer 13 may include two inorganic layers and an organic layer between the two inorganic layers.

In some embodiments of the present disclosure, the first encapsulation layer 13 may be recessed to form a pit 1301 in the region corresponding to the recessed part 61. Of course, if the thickness of the first encapsulation layer 13 is large, the surface of the first encapsulation layer 13 away from the substrate 1 can also remain substantially flat.

The color filter layer 14 is disposed on the side of the first encapsulation layer 13 away from the second electrode 6, and the color filter layer 14 includes filter regions corresponding to each first electrode 31 one by one. The color filter regions have multiple colors, such as red, blue and green.

The second encapsulation layer 15 may cover the color filter layer 14, and its structure may be the same as that of the first encapsulation layer 13.

The transparent cover plate 16 can cover the second encapsulation layer 15, and its material can be glass or other material.

In addition, in some embodiments of the present disclosure, as shown in FIGS. 12 and 13, the fourth display panel may further include a light extraction layer 17, which covers the surface of the second electrode 6 away from the substrate 1, and is recessed in the area corresponding to the recessed part 61. The first encapsulation layer 13 is provided on the side of the light extraction layer 17 away from the substrate 1. The refractive index of the light extraction layer 17 is greater than that of the second electrode 6, which can improve the light extraction efficiency. The higher the refractive index is, the higher the light extraction efficiency will be. In the display panel according to any one of the above embodiments, the two sidewalls of the pit are narrowed and connected in a direction approaching the substrate.

Embodiments of the present disclosure also provide a method for manufacturing a display panel, which display panel may be the first type of display panel described above. As shown in FIG. 14, the manufacturing method includes steps S110 to S160.

Step S110, a first insulation layer is formed on a side of a substrate.

Step S120, a plurality of separation grooves is formed on the surface of the first insulation layer away from the substrate, so as to separate a plurality of pixel regions distributed in an array.

Step S130, a first electrode layer including a plurality of first electrodes is formed on the surface of the first insulation layer away from the substrate. The orthographic projection of each first electrode on the first insulation layer is located in a respective pixel region in a one-to-one correspondence. The first electrode includes a flat middle part and an edge part surrounding the middle part. The edge part includes a flat part surrounding the middle part and a sloped part connected between the middle part and the flat part, wherein the thickness of the flat part is smaller than that of the middle part.

Step S140, a pixel definition layer is formed on the surface of the first insulation layer away from the substrate, the pixel definition layer exposing at least a portion of the middle part.

Step S150: a light-emitting function layer is formed covering the pixel definition layer and the middle part and the first insulation layer exposed by the pixel definition layer.

Step S160, a second electrode is formed covering the light-emitting function layer.

The details and beneficial effects of each layer structure during the manufacturing method according to an embodiment of the present disclosure have been described in the above embodiments of the first display panel, and will not be repeated here.

Embodiments of the present disclosure also provide a method for manufacturing a display panel, which display panel may be the first display panel described above. As shown in FIG. 15, the manufacturing method includes step S210 to step S250.

Step S210, a first insulation layer is formed on a side of a substrate.

Step S220, a first electrode layer including a plurality of first electrodes and a separation groove are formed on the surface of the first insulation layer away from the substrate. The first electrode includes a flat middle part and an edge part surrounding the middle part. The edge part includes a flat part surrounding the middle part and a sloped part connected between the middle part and the flat part, wherein the thickness of the flat part is smaller than that of the middle part. The separation groove separates a plurality of pixel regions distributed in an array on the first insulation layer. The orthographic projection of each first electrode on the first insulation layer is located within a respective pixel region in a one-to-one correspondence.

Step S230, a pixel definition layer is formed on the surface of the first insulation layer away from the substrate, the pixel definition layer exposing at least a portion of the middle part.

Step S240, a light-emitting functional layer is formed, the light-emitting functional layer covering the pixel definition layer as well as the middle part and the first insulation layer exposed by the pixel definition layer.

Step S250, a second electrode is formed covering the light-emitting function layer.

In the manufacturing method according to this embodiment, a conductive layer may be formed first on the surface of the first insulation layer away from the substrate, and the conductive layer may be patterned by a gray-scale mask process to obtain the first electrode layer. In the meantime, the gray-scale mask process can be used to form the separation grooves. Compared with the method for forming the first electrode layer and the separation groove separately by two mask processes, the manufacturing process of the display panel can be simplified.

Embodiments of the present disclosure also provide a method for manufacturing a display panel, which display panel can be the above-mentioned second display panel. As shown in FIG. 16, the manufacturing method includes steps S310 to S340.

Step S310, a first insulation layer is formed on a side of a substrate.

Step S320, a first electrode layer including a plurality of first electrodes is formed on the surface of the first insulation layer facing away from the substrate. The first electrode includes a flat middle part and an edge part surrounding the middle part. The edge part includes a flat part surrounding the middle part and a sloped part connected between the middle part and the flat part, wherein the thickness of the flat part is smaller than that of the middle part.

Step S330: a light-emitting function layer is formed covering at least a portion of the middle part.

Step S340, a second electrode is formed covering the light-emitting function layer. The second electrode includes a recessed part and a plurality of smooth parts separated by the recessed part, and the orthographic projection of each smooth part on the first insulation layer is located within a respective first electrode in a one-to-one correspondence. The recessed part is recessed toward the side of the smooth part close to the substrate, and the orthographic projection of the recessed part on the first insulation layer is at least partially located outside the middle part.

The details and beneficial effects of each layer structure during the manufacturing method according to an embodiment of the present disclosure have been described in the above embodiments of the second display panel, and will not be repeated here.

Embodiments of the present disclosure also provide a method for manufacturing a display panel. The display panel may be the above-mentioned third display panel. As shown in FIG. 17, a method for manufacturing a display panel includes steps S410 to S450.

Step S410, a first insulation layer is formed on a side of a substrate. The first insulation layer has a plurality of pixel regions distributed in an array and a separation region separating the pixel regions;

Step S420, a first electrode layer including a plurality of first electrodes is formed on the surface of the first insulation layer away from the substrate. The orthographic projection of each first electrode on the first insulation layer is located within a respective pixel region.

Step S430, a pixel definition layer is formed on the surface of the first insulation layer away from the substrate, and exposing each of the first electrodes. The pixel definition layer is formed with a pixel definition groove in a region corresponding to the separation region. The middle part of the pixel definition groove has a first protrusion protruding in a direction away from the substrate, and a sub-groove is formed between the sidewall of the first protrusion and the sidewall of the pixel definition groove.

Step S440, a light-emitting functional layer is formed, the light-emitting functional layer covering the pixel definition layer and the first electrode exposed by the pixel definition layer.

Step S450, a second electrode is formed covering the light-emitting function layer.

The details and beneficial effects of each layer structure during the manufacturing method according to an embodiment of the present disclosure have been described in the above embodiment of the third display panel, and will not be repeated here.

Embodiments of the present disclosure also provide a method for manufacturing a display panel, which display panel may be the fourth display panel described above. As shown in FIG. 18, a method for manufacturing a display panel includes steps S510 to S540.

Step S510, a first insulation layer is formed on a side of a substrate.

Step S520, a first electrode layer is formed on the surface of the first insulation layer facing away from the substrate, the first electrode layer including a plurality of first electrodes.

Step S530: a pixel definition layer is formed on the surface of the first insulation layer away from the substrate, and the pixel definition exposes each of the first electrodes.

Step S540, a light-emitting functional layer is formed, the light-emitting functional layer covering the pixel definition layer and the first electrode exposed by the pixel definition layer.

Step S550, a second electrode is formed covering the light-emitting function layer. The second electrode includes a recessed part and a plurality of smooth parts separated by the recessed part, and the orthographic projection of each smooth part on the first insulation layer is located within a respective first electrodes. At least a part of the recessed part is recessed toward the side of the smooth part close to the substrate, and the orthographic projection of the recessed part on the first insulation layer is at least partially located outside the first electrode. A second protrusion is provided in the middle part of the recessed part, and a sub-recess is formed between the side surface of the second protrusion and the side surface of the recessed part.

The details and beneficial effects of each layer structure during the manufacturing method according to an embodiment of the present disclosure have been described in the above embodiment of the fourth display panel, and will not be repeated here.

It should be noted that although the various steps of the manufacturing method in the present disclosure are described in a specific order in the drawings, this does not require or imply that these steps must be performed in the specific order, or that all the steps shown must be performed in order to achieve the desired result. Additionally or alternatively, some steps may be omitted, multiple steps may be combined into one step for execution, and/or one step may be decomposed into multiple steps for execution, etc.

Embodiments of the present disclosure also provide a display device, which may include any one of the above-mentioned first display panel, second display panel, third display panel, and fourth display panel. For the specific structure and beneficial effects, reference may be made to the above embodiments, which will not be repeated here. The display device of the present disclosure can be used in electronic devices such as mobile phones, tablet computers, televisions, etc., which will not be listed here.

Those skilled in the art will easily think of other embodiments of the present disclosure after considering the specification and practicing the invention disclosed herein. The present application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are defined by the appended claims.

The invention claimed is:

1. A display panel, comprising:
   a substrate; and
   an organic light-emitting device located on the substrate, wherein
   the organic light-emitting device comprises a plurality of first electrodes, an organic light-emitting layer, a second electrode layer, and a color filter layer;
   a first film layer is located between the second electrode layer and the color filter layer;
   the first film layer comprises a first surface close to the second electrode layer and a second surface away from the second electrode layer;
   the second electrode layer comprises a first sub-recess and a second sub-recess located on a surface away from the substrate and recessed in a direction toward the substrate; and
   the second surface comprises a third recessed part located between the first sub-recess and the second sub-recess in an extending direction of the substrate, the third recessed part being recessed in the direction toward the substrate, wherein
   the display panel further comprises:
   a first insulation layer, provided on a side of the substrate; and
   a pixel definition layer, provided on the surface of the first insulation layer away from the substrate and exposing each of the first electrodes.

2. The display panel according to claim 1, wherein contours of the first sub-recess and the second sub-recess form a W shape.

3. The display panel according to claim 1, wherein a contour of the third recessed part is in a V shape.

4. The display panel according to claim 1, wherein a slope of a sidewall of the third recessed part is smaller than a slope of a sidewall of the first sub-recess or the second sub-recess.

5. The display panel according to claim 1, wherein the third recessed part, the first sub-recess, and the second sub-recess are located in gaps between the plurality of first electrodes.

6. The display panel according to claim 1, wherein the second electrode layer further comprises a protrusion part located on the surface away from the substrate and protruding in a direction away from the substrate.

7. The display panel according to claim 6, wherein an orthographic projection of the protrusion part at least partially overlaps with an orthographic projection of an edge part of the first electrode.

8. The display panel according to claim 6, wherein an orthographic projection of the protrusion part at least partially overlaps with an orthographic projection of an edge of a pixel definition layer.

9. The display panel according to claim 1, wherein
   the first insulation layer comprises a plurality of pixel regions distributed in an array and a separation region separating the pixel regions; and
   the pixel definition layer is formed with a pixel definition groove in a region corresponding to the separation region, a middle part of the pixel definition groove comprises a first protrusion protruding in a direction away from the substrate, and a sub-groove is formed between a sidewall of the first protrusion and a sidewall of the pixel definition groove.

10. The display panel according to claim 9, wherein two sidewalls of the first protrusion are inclined surfaces that expand toward the substrate and two sidewalls of the pixel definition groove are inclined surfaces that contract toward the substrate.

11. The display panel according to claim 9, wherein a slope of a sidewall of the first protrusion is different from a slope of a sidewall of the pixel definition groove.

12. The display panel according to claim 9, wherein a thickness of the first protrusion is smaller than a depth of the pixel definition groove.

13. The display panel according to claim 9, wherein an orthographic projection of a middle part of the pixel definition groove on the first insulation layer is located in the separation region.

14. The display panel according to claim 9, wherein the pixel definition layer comprises a spacing part and an extension part, the spacing part is located in an area other than the first electrodes, and the pixel definition groove is provided in the spacing part, wherein the extension part is connected to the spacing part, extends to the surface of the first electrodes away from the substrate, and covers the first electrodes partially.

15. The display panel according to claim 9, wherein the first sub-recess and the second sub-recess are located in a region corresponding to the pixel definition groove.

16. The display panel according to claim 6, wherein the protrusion part is located at sides of the first sub-recess and the second sub-recess closer to the first electrode than a middle part of a pixel definition groove.

17. The display panel according to claim 1, wherein the first film layer comprises an encapsulation layer and a light extraction layer.

18. The display panel according to claim 1, wherein at least two of the first electrodes have different thicknesses.

19. A display panel, comprising:
a substrate; and
an organic light-emitting device located on the substrate, wherein
the organic light-emitting device comprises a plurality of first electrodes, an organic light-emitting layer, a second electrode layer, and a color filter layer;
a first film layer is located between the second electrode layer and the color filter layer;

the first film layer comprises a first surface close to the second electrode layer and a second surface away from the second electrode layer;
the first surface comprises a first protrusion part and a second protrusion part protruding in a direction toward the substrate;
the second surface comprises a third recessed part located between the first protrusion part and the second protrusion part in an extending direction of the substrate, the third recessed part being recessed in the direction toward the substrate, wherein
the display panel further comprises:
a first insulation layer, provided on a side of the substrate; and
a pixel definition layer, provided on the surface of the first insulation layer away from the substrate and exposing each of the first electrodes.

20. A display device comprising a display panel, wherein the display panel comprises:
a substrate; and
an organic light-emitting device located on the substrate, wherein
the organic light-emitting device comprises a plurality of first electrodes, an organic light-emitting layer, a second electrode layer, and a color filter layer;
a first film layer is located between the second electrode layer and the color filter layer;
the first film layer comprises a first surface close to the second electrode layer and a second surface away from the second electrode layer;
the second electrode layer comprises a first sub-recess and a second sub-recess located on a surface away from the substrate and recessed in a direction toward the substrate; and
the second surface comprises a third recessed part located between the first sub-recess and the second sub-recess in an extending direction of the substrate, the third recessed part being recessed in the direction toward the substrate, wherein
the display panel further comprises:
a first insulation layer, provided on a side of the substrate; and
a pixel definition layer, provided on the surface of the first insulation layer away from the substrate and exposing each of the first electrodes.

* * * * *